United States Patent
Okada

(10) Patent No.: US 9,599,506 B2
(45) Date of Patent: Mar. 21, 2017

(54) OPTICAL SENSOR AND ELECTRONIC APPARATUS WITH A FIRST AUXILIARY CURRENT AND CURRENT AMPLIFIER

(71) Applicant: SHARP KABUSHIKI KAISHA, Osaka-shi, Osaka (JP)

(72) Inventor: Norikazu Okada, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 219 days.

(21) Appl. No.: 14/433,695

(22) PCT Filed: Sep. 24, 2013

(86) PCT No.: PCT/JP2013/075690
§ 371 (c)(1),
(2) Date: Apr. 6, 2015

(87) PCT Pub. No.: WO2014/057797
PCT Pub. Date: Apr. 17, 2014

(65) Prior Publication Data
US 2015/0276474 A1 Oct. 1, 2015

(30) Foreign Application Priority Data
Oct. 12, 2012 (JP) .................. 2012-227409

(51) Int. Cl.
*G01J 1/44* (2006.01)
*H03K 17/78* (2006.01)
(52) U.S. Cl.
CPC ................ *G01J 1/44* (2013.01); *H03K 17/78* (2013.01)

(58) Field of Classification Search
CPC .......... G01J 1/44; G01J 1/4204; G01J 3/0264; H03K 17/78; H03F 3/08; H01L 27/14609; H05B 41/3922; H04B 10/6911
See application file for complete search history.

(56) References Cited

U.S. PATENT DOCUMENTS

| | | | |
|---|---|---|---|
| 6,144,197 A | 11/2000 | Shimamura et al. | |
| 2005/0051704 A1* | 3/2005 | Kashiura | G01J 1/44 250/214 A |
| 2008/0237669 A1* | 10/2008 | Yanagisawa | G01J 1/4204 257/292 |
| 2013/0068926 A1 | 3/2013 | Okada | |
| 2014/0291488 A1* | 10/2014 | Laforce | G01J 1/44 250/214 LA |

FOREIGN PATENT DOCUMENTS

| | | |
|---|---|---|
| JP | 10-209839 A | 8/1998 |
| JP | 10-332722 A | 12/1998 |
| JP | 2013-80892 A | 5/2013 |
| JP | 2013-247530 A | 12/2013 |

\* cited by examiner

*Primary Examiner* — Francis M Legasse, Jr.
(74) *Attorney, Agent, or Firm* — Birch, Stewart, Kolasch & Birch, LLP

(57) ABSTRACT

A light-receiving sensor (1) includes: a photodiode (PD) for generating a photocurrent by use of a light input; and a first current source (CS), provided in parallel to the photodiode (PD), for generating a first auxiliary current by being driven by a voltage between terminals, which are a terminal (T1) and a terminal (T2). The first current source (CS) is also driven by the voltage between the terminals which voltage is obtained when no light is inputted.

10 Claims, 12 Drawing Sheets

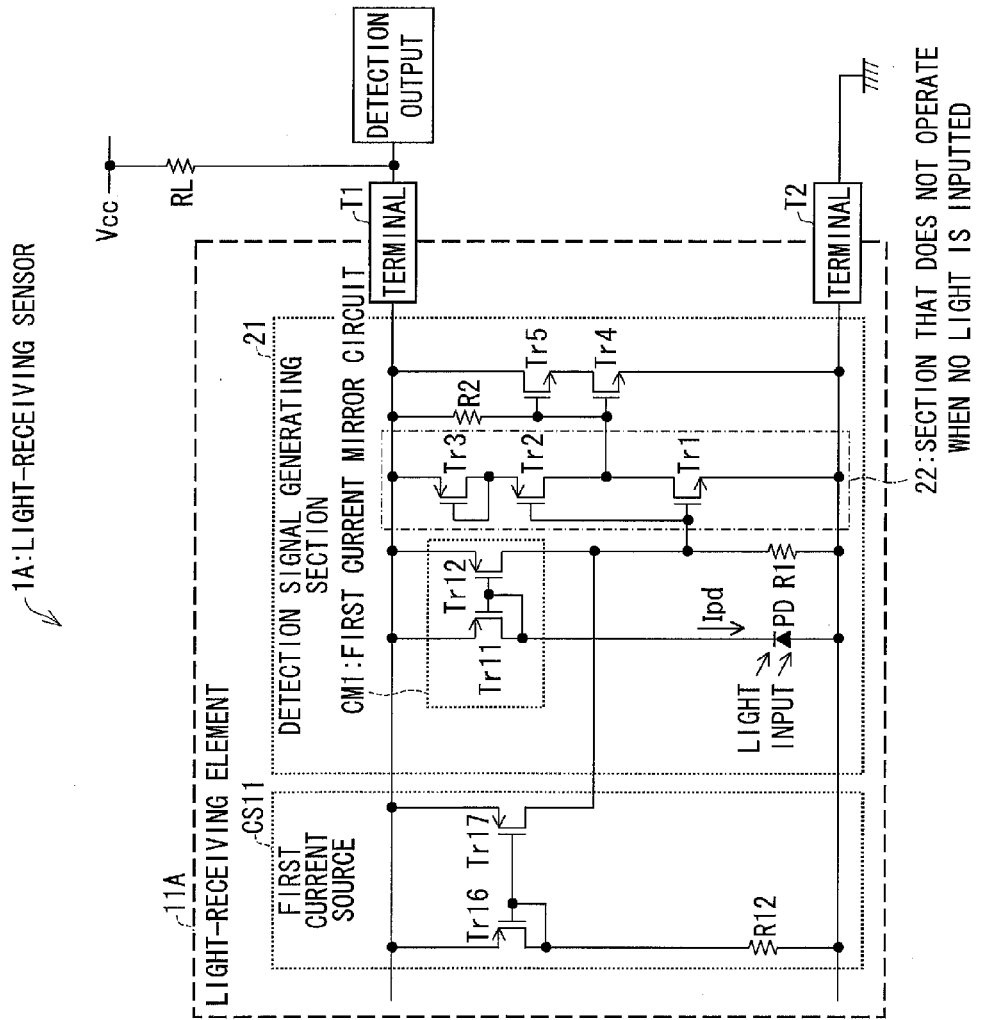
F I G. 4

F I G. 6
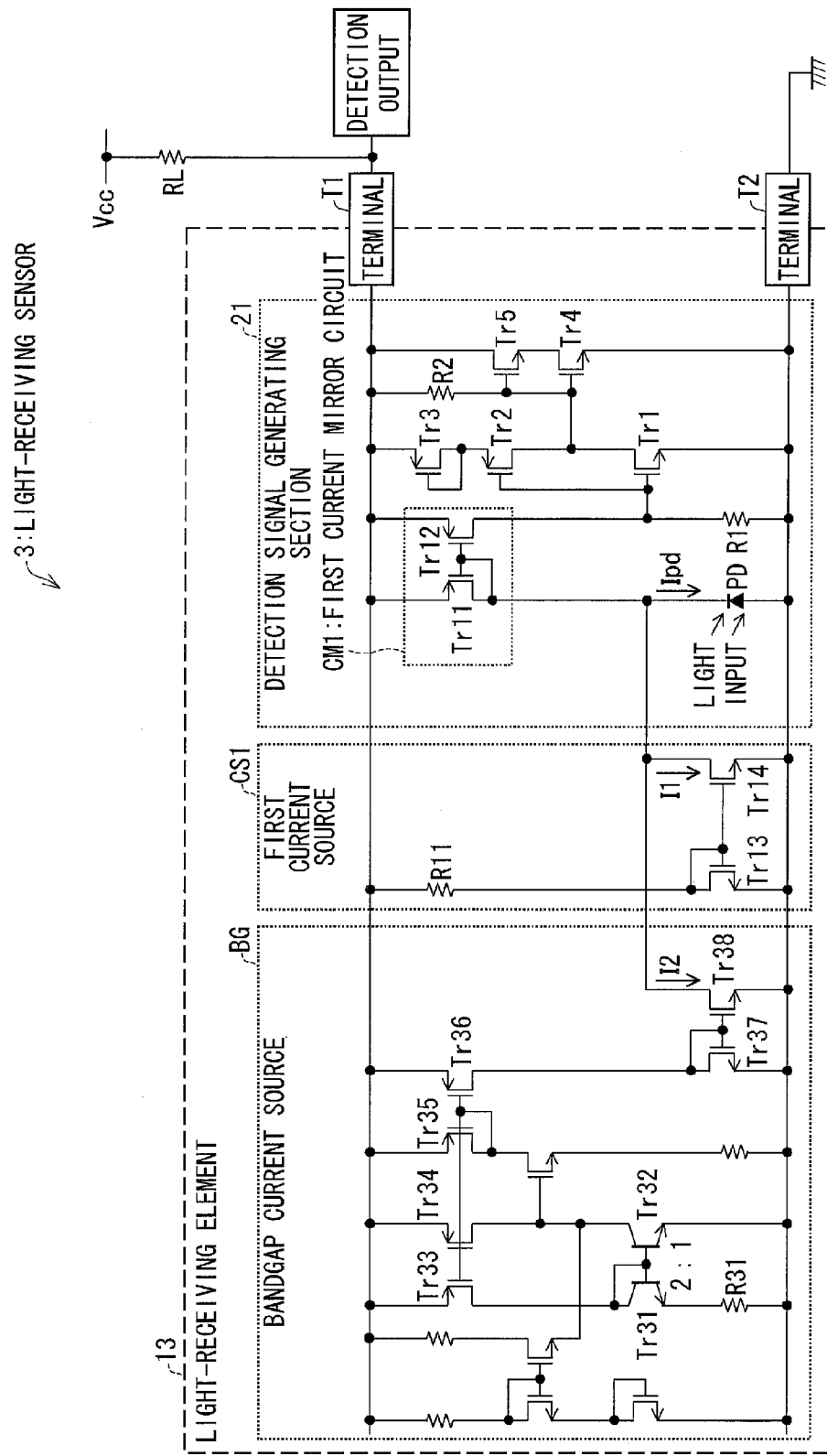

F I G. 9
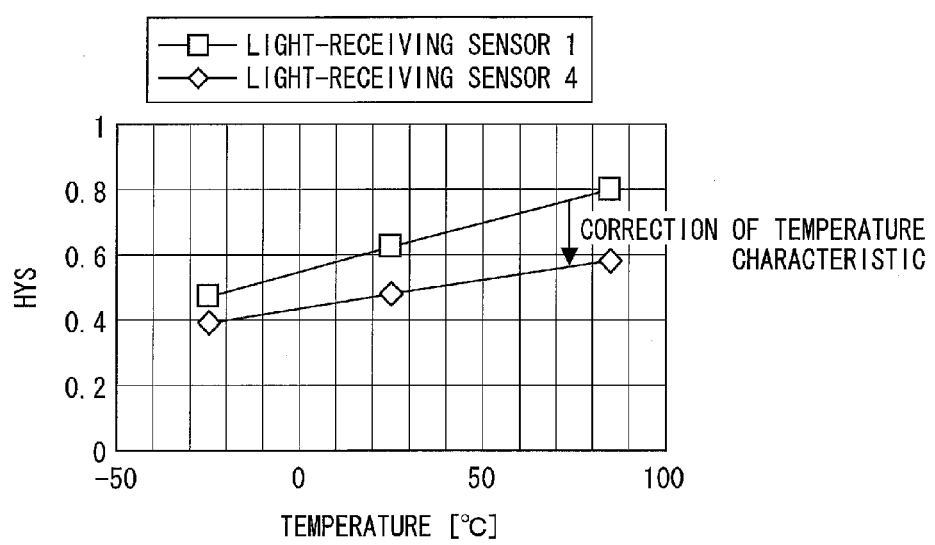

OPTICAL SENSOR AND ELECTRONIC APPARATUS WITH A FIRST AUXILIARY CURRENT AND CURRENT AMPLIFIER

TECHNICAL FIELD

The present invention relates to a two-terminal optical sensor suitable for, for example, a photo interrupter used for detection of an object and detection of a motion speed of an object.

BACKGROUND ART

In an electrical apparatus such as a digital camera or an ink jet printer including an operation component driven by a motor, a sensor is used to detect a motion speed of the operation component. The sensor generally has three types of terminals: a power supply terminal, a sensor output terminal, and a GND terminal. This makes it difficult to make the sensor smaller so that the sensor made smaller is suited to such an electrical apparatus that is made smaller. A wire-saved optical sensor is required for a reduction in process for manufacturing sensors, and for an increase in yield of the sensors. In order to meet such a requirement, a sensor having fewer terminals is being developed.

For example, Patent Literature 1 discloses a detecting device that is usable as a two-terminal sensor by causing a sensor output terminal and a GND terminal to be shared with each other. In this detecting device, sensor means including a detection element (detecting section) is driven at a constant voltage generated by constant voltage generating means. Then, an output of the sensor means is compared with a comparative voltage by comparison means. Further, in the detecting device, a high current value and a low current value of a rectangular wave current are switched by on and off outputs of a comparator of the comparison means.

Patent Literature 2 discloses a detecting device that is usable as a two-terminal sensor by causing a power supply terminal and a sensor output terminal to be shared with each other. In this detecting device, an output of sensor is compared, by a comparator, with a voltage obtained by causing a resistance to divide a reference voltage outputted from reference voltage generating means. Then, an output of the comparator is outputted to current amplification means or current setting means via two-wire/three-wire switching means. As described above, the detecting device thus including the two-wire/three-wire switching means is usable as a two-wire/three-wire detecting device.

CITATION LIST

Patent Literatures

Patent Literature 1
Japanese Patent Application Publication
Toukaihei No. 10-332722 (Publication Date: Dec. 18, 1998)
Patent Literature 2
Japanese Patent Application Publication
Toukaihei No. 10-209839 (Publication Date: Aug. 7, 1998)

SUMMARY OF INVENTION

Technical Problem

However, a decrease in voltage between two terminals is insufficient in the detecting device of Patent Literature 1, which includes the constant voltage generating means and the comparison means. This causes a low-level detection signal to be a high voltage. The following explains the reason for this.

The comparator of the comparison means that carries out comparison by generating a comparative voltage as described above is configured by a differential amplifier in terms of an electronic circuit. Each one of transistors of the differential amplifier requires approximately 0.7 V as an operation voltage. Therefore, at least two transistors of the differential amplifier, which need to be connected in series, require a voltage of at least approximately 1.4 V.

Further, in a case where the comparator is formed within a circuit of the constant voltage generating means, the circuit needs to be configured at a voltage that is higher than that of the comparator. In this case, the circuit requires a voltage of at least approximately 2.1 V.

Hence, such a voltage causes a lowest voltage between the two terminals to be high. This prevents the low-level detection signal from being a sufficiently low voltage. Thus, it is difficult to further widen an operation range of the detecting device.

Also in the detecting device of Patent Literature 2, which includes the constant voltage generating means and the comparison means, a decrease in voltage between two terminals is similarly insufficient. Therefore, switching from a two-wire system to a three-wire system is necessary for a sufficient decrease in voltage.

In order to avoid such a disadvantage, it is desirable to sufficiently decrease a voltage in an optical sensor by widening a potential difference between two terminals.

Moreover, false detection occurs in an optical sensor in a case where a voltage between two terminals is unstable during a transition from a light input state to a light non-input state, or during a transition from the light non-input state to the light input state. Therefore, it is desirable in an optical sensor that a voltage between two terminals be stably switched between a high level and a low level.

The present invention has been made in the view of the problem, and an object of the present invention is to, in a two-terminal optical sensor, sufficiently decrease a voltage between two terminals, and stabilize the voltage during switching between a light input state and a light non-input state.

Solution to Problem

In order to attain the object, an optical sensor according to an aspect of the present invention is an optical sensor that has two terminals and detects a light input by changing, with respect to a fixed potential of a first terminal of the two terminals, a potential of a second terminal of the two terminals to which second terminal a power supply voltage is applied, the optical sensor including: a photoelectric conversion element for generating a photocurrent by use of the light input; a first current source for generating a first auxiliary current by being driven by a voltage between terminals, which are the first terminal and the second terminal; a current amplifier for amplifying the photocurrent; a current control section for stopping a current between the terminals, which are the first terminal and the second terminal, in accordance with an output current that is outputted from the current amplifier when light is inputted, and causing the current between the terminals to flow in accordance with an output current that is outputted from the current amplifier when no light is inputted, the first current source generating the first auxiliary current regardless of presence of the light input either by inputting the first auxiliary current to the current amplifier or by adding the first auxiliary current to the output current of the current amplifier.

Advantageous Effects of Invention

An embodiment of the present invention yields an effect of, in a two-terminal optical sensor, sufficiently decreasing a voltage between two terminals, and stabilizing the voltage during switching between a light input state and a light non-input state.

Figure 1:
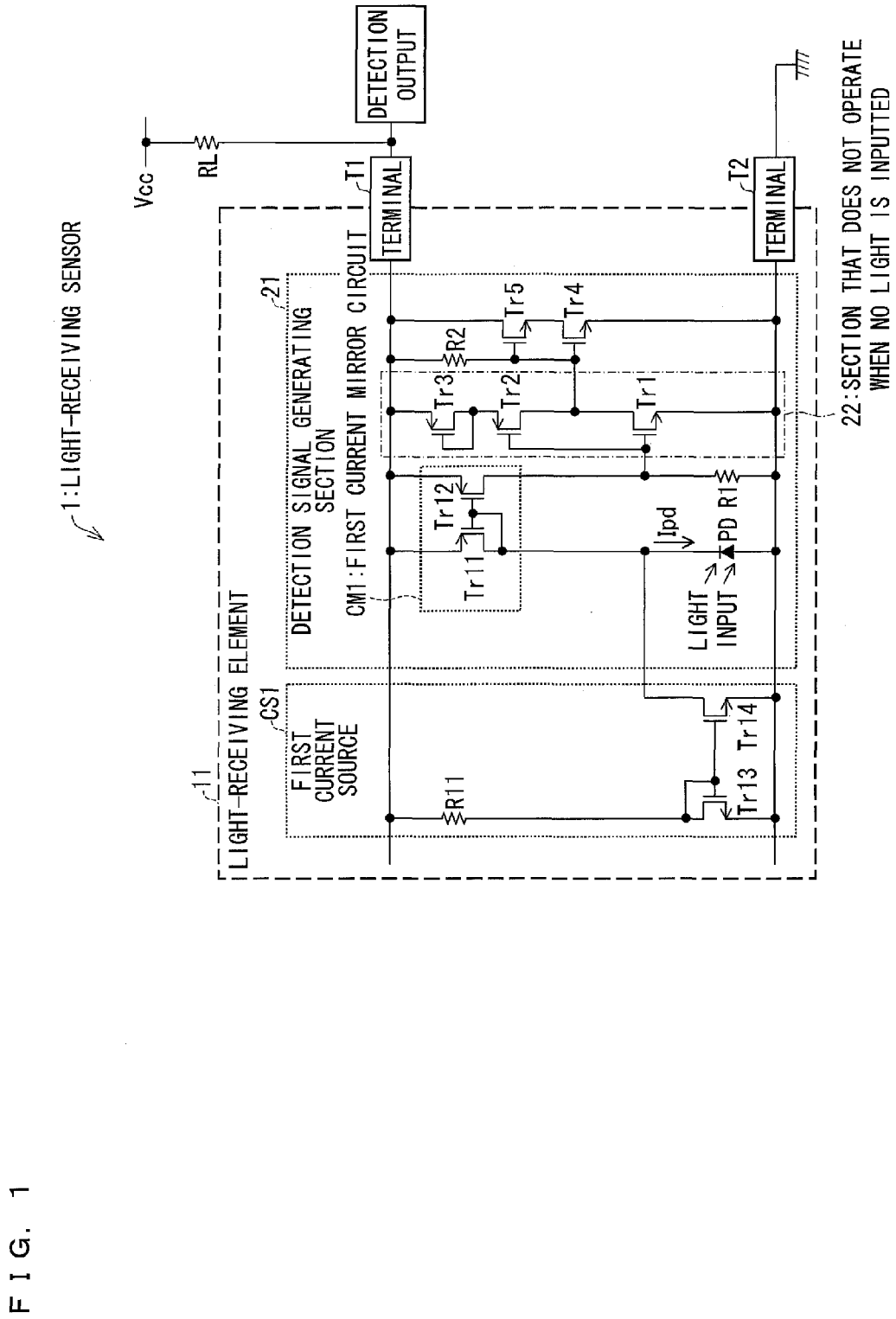
FIG. 1 is a circuit diagram illustrating a configuration of a light-receiving sensor according to Embodiment 1 of the present invention.
Figure 2:
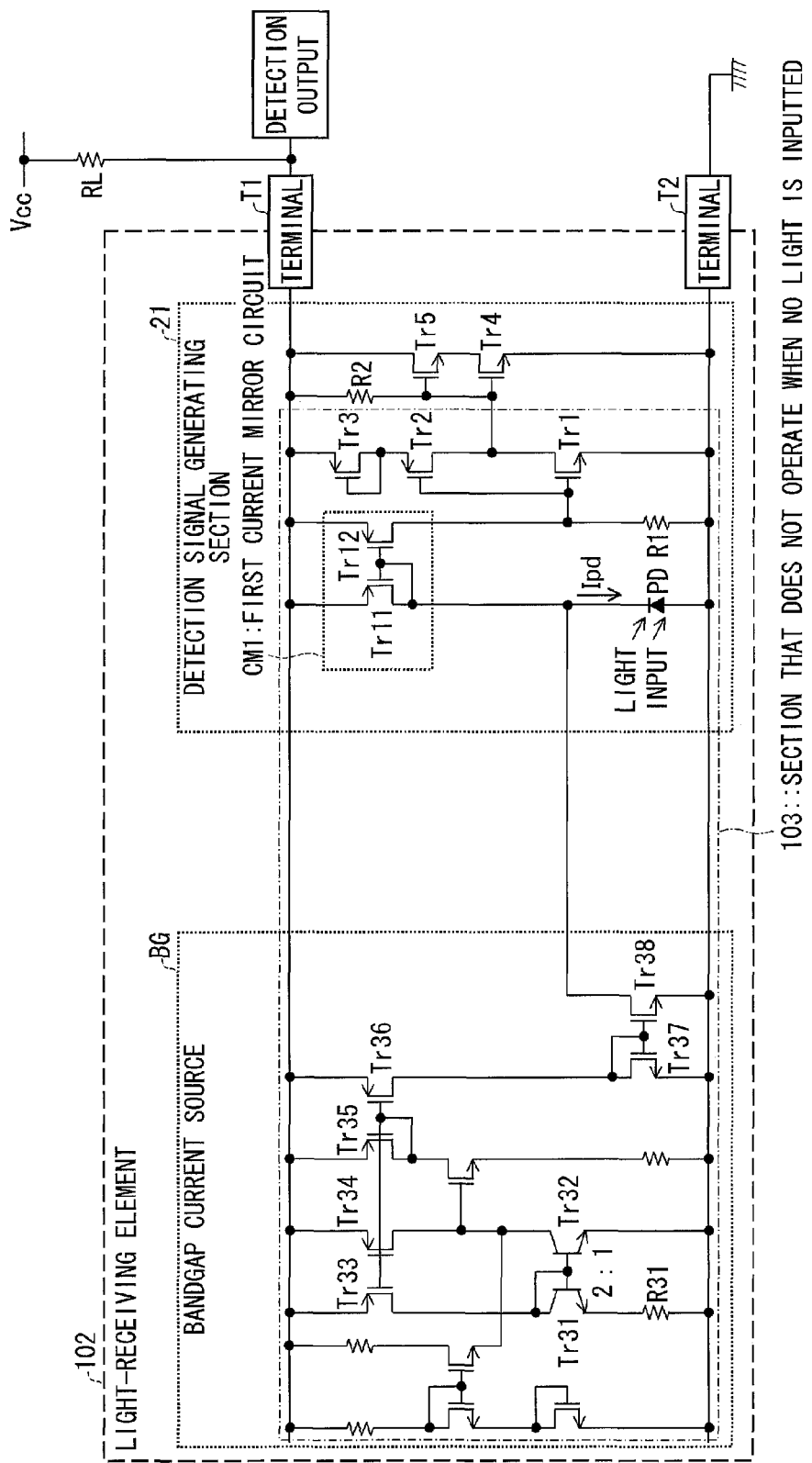
FIG. 2 is a circuit diagram illustrating a configuration of a light-receiving sensor according to a comparative example of Embodiment 1.
Figure 3:
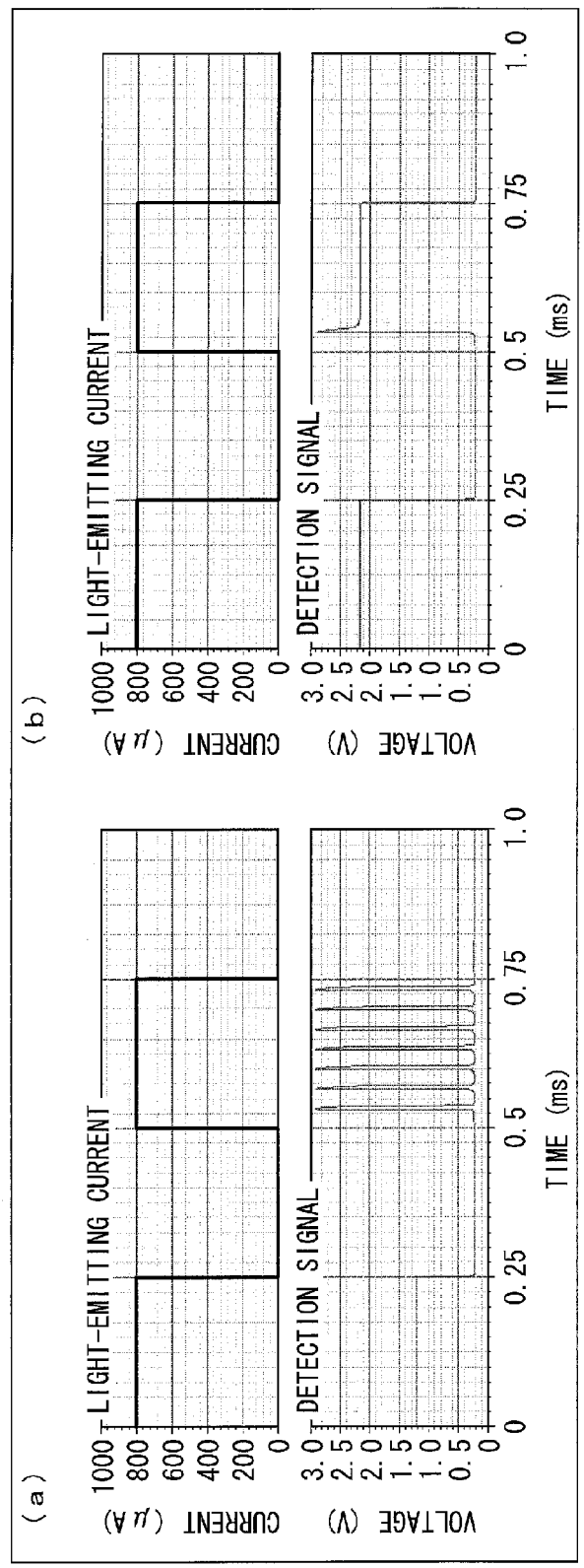

(a) of FIG. 3 is a waveform chart illustrating a waveform of input light and a waveform of a detection signal in accordance with a simulation of an operation of the light-receiving sensor illustrated in FIG. 2. (b) of FIG. 3 is a waveform chart illustrating a waveform of input light and a waveform of a detection signal in accordance with a simulation of an operation of the light-receiving sensor illustrated in FIG. 1.

FIG. 4 is a circuit diagram illustrating a configuration of a light-receiving sensor according to a modified example of Embodiment 1 of the present invention.

Figure 5:
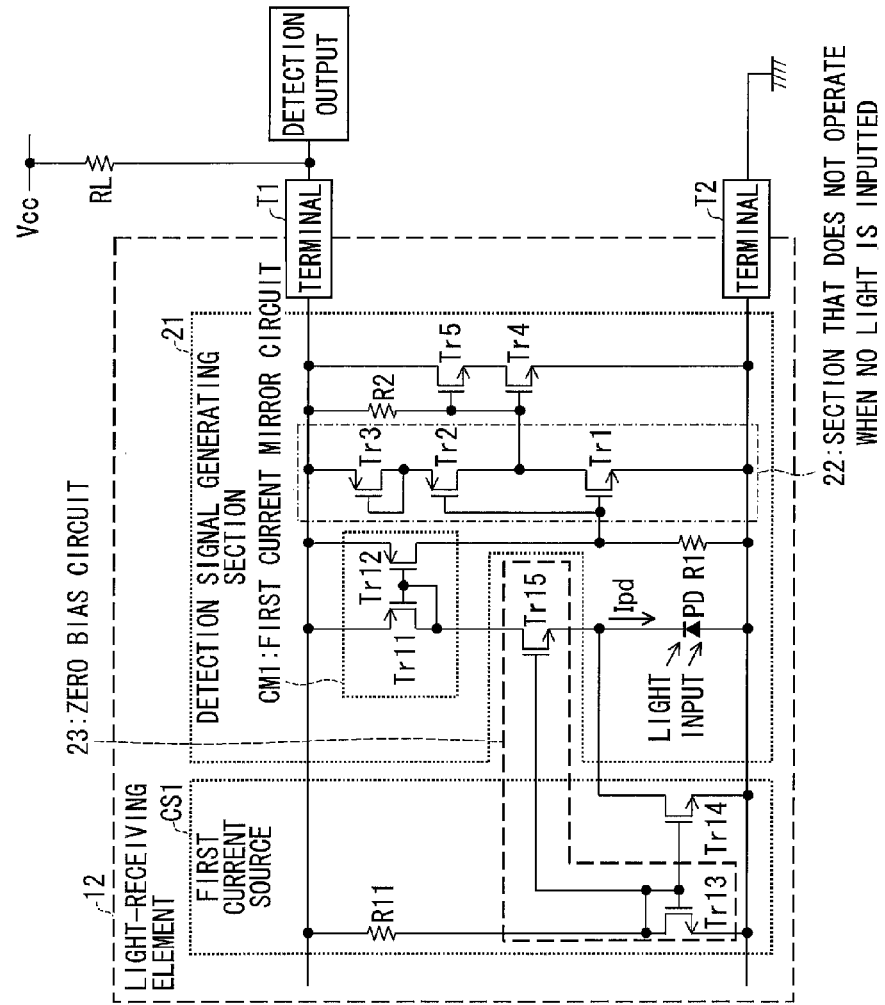

FIG. 5 is a circuit diagram illustrating a configuration of a light-receiving sensor according to Embodiment 2 of the present invention.

FIG. 6 is a circuit diagram illustrating a configuration of a light-receiving sensor according to Embodiment 3 of the present invention.

Figure 7:
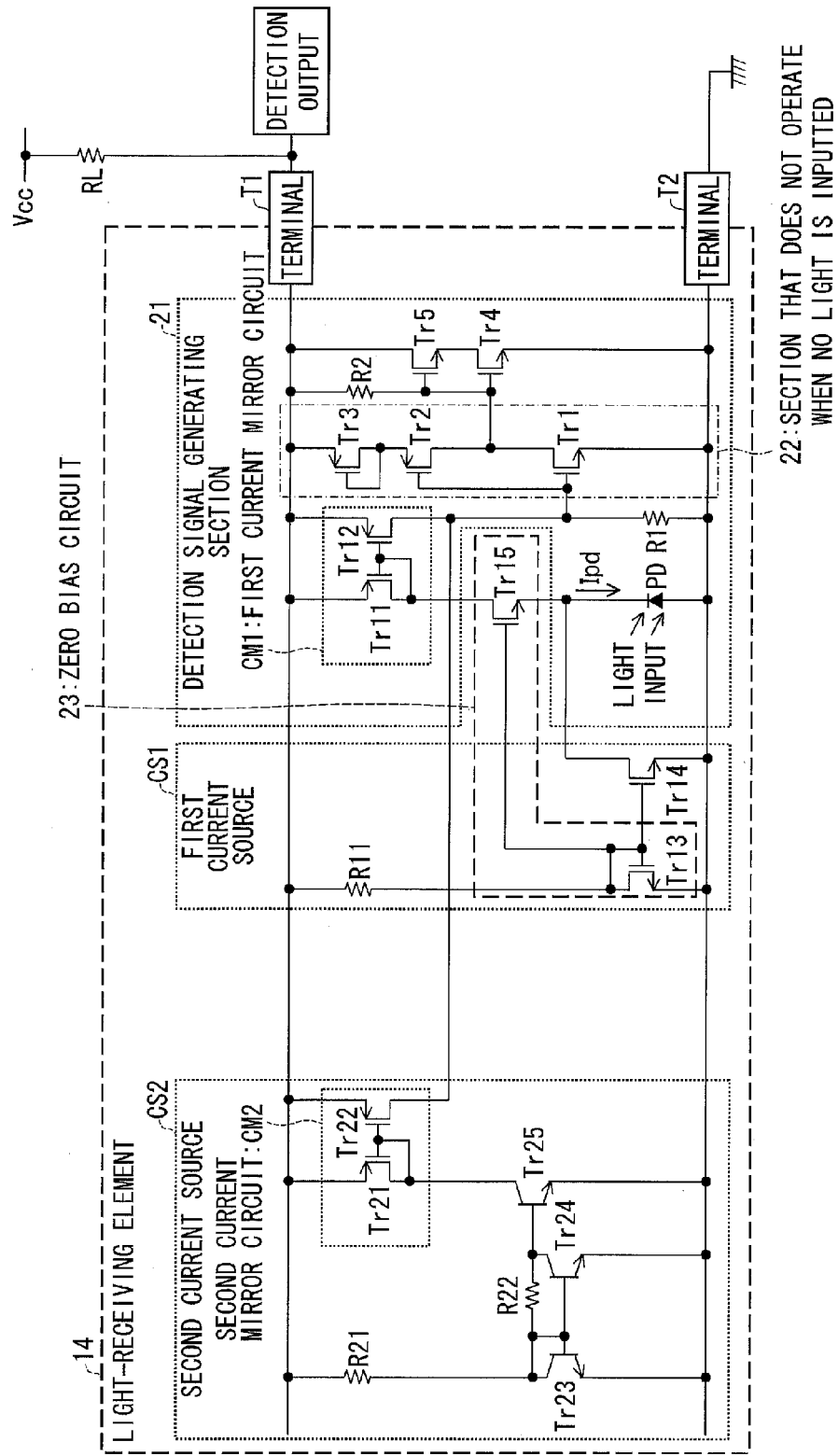

FIG. 7 is a circuit diagram illustrating a configuration of a light-receiving sensor according to Embodiment 4 of the present invention.

Figure 8:
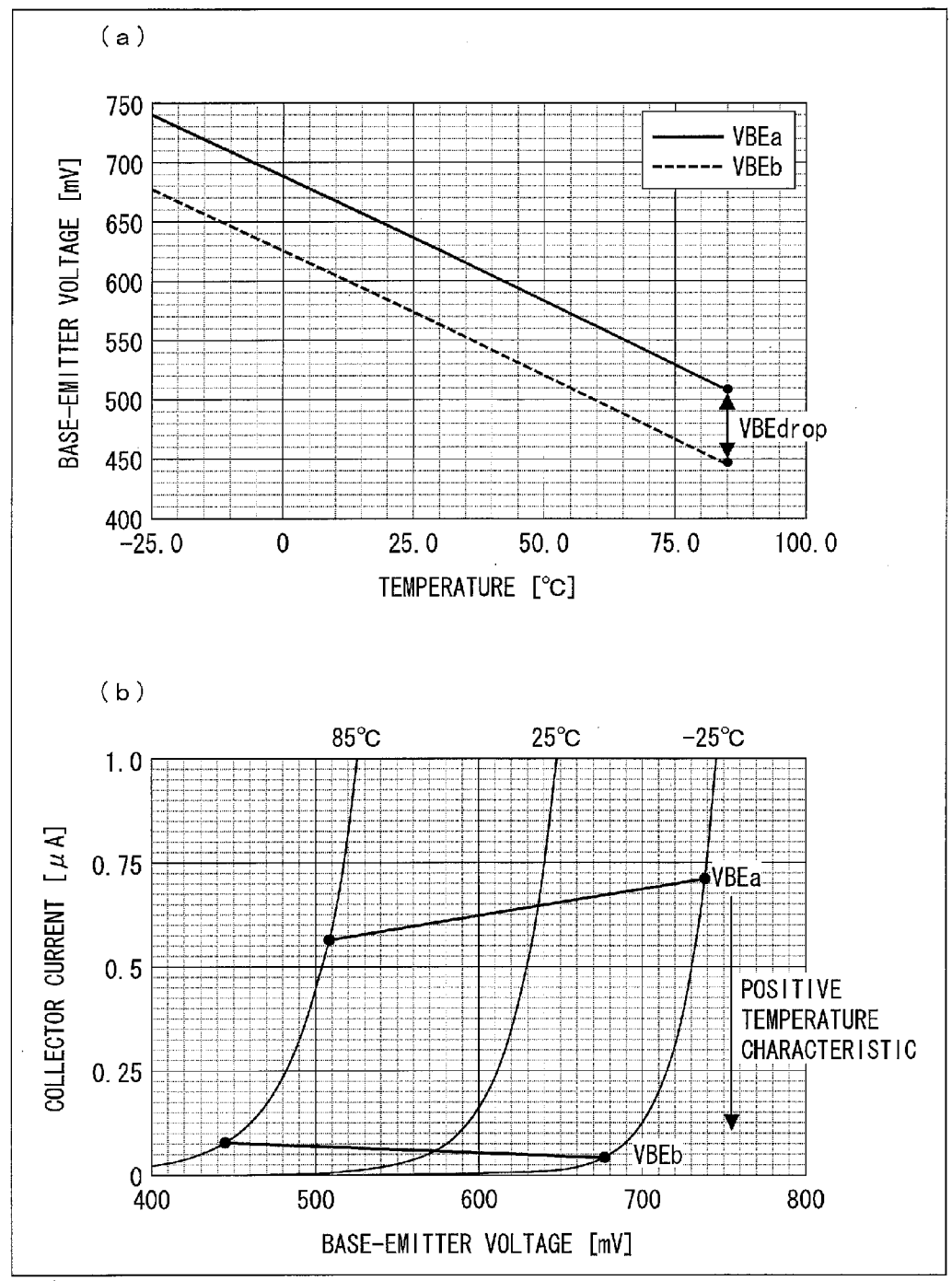

(a) of FIG. 8 is a graph showing a result of a simulation of a characteristic of a base-emitter voltage of a transistor with respect to a temperature in a second current source of the light-receiving sensor of FIG. 7. (b) of FIG. 8 is a graph showing a result of a simulation of a characteristic of a current with respect to the base-emitter voltage of the transistor of the second current source.

FIG. 9 is a graph showing a result of a simulation of a hysteresis characteristic with respect to a temperature of the light-receiving sensor of FIG. 7.

Figure 10:
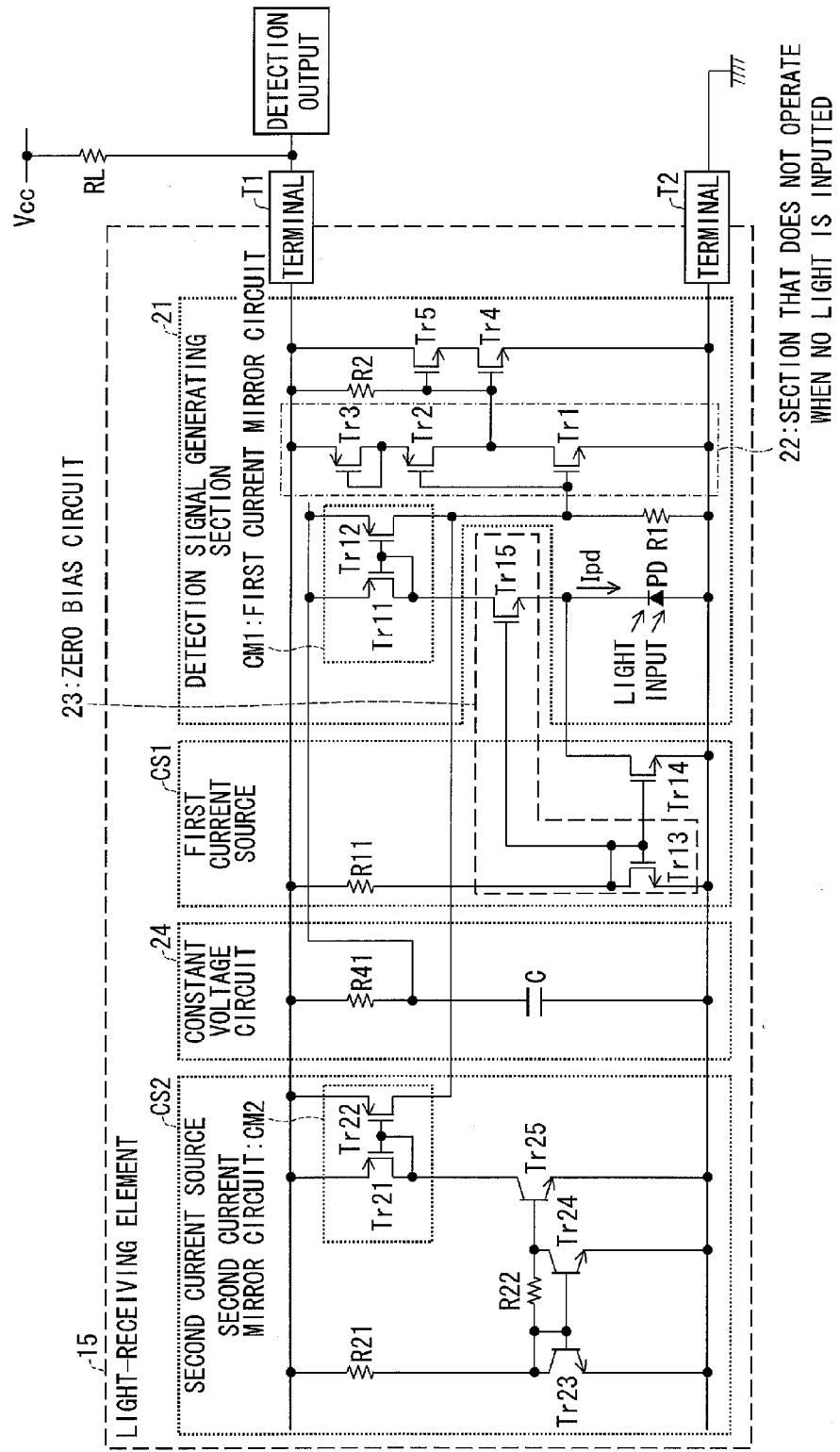

FIG. 10 is a circuit diagram illustrating a light-receiving sensor according to Embodiment 5 of the present invention.

Figure 11:
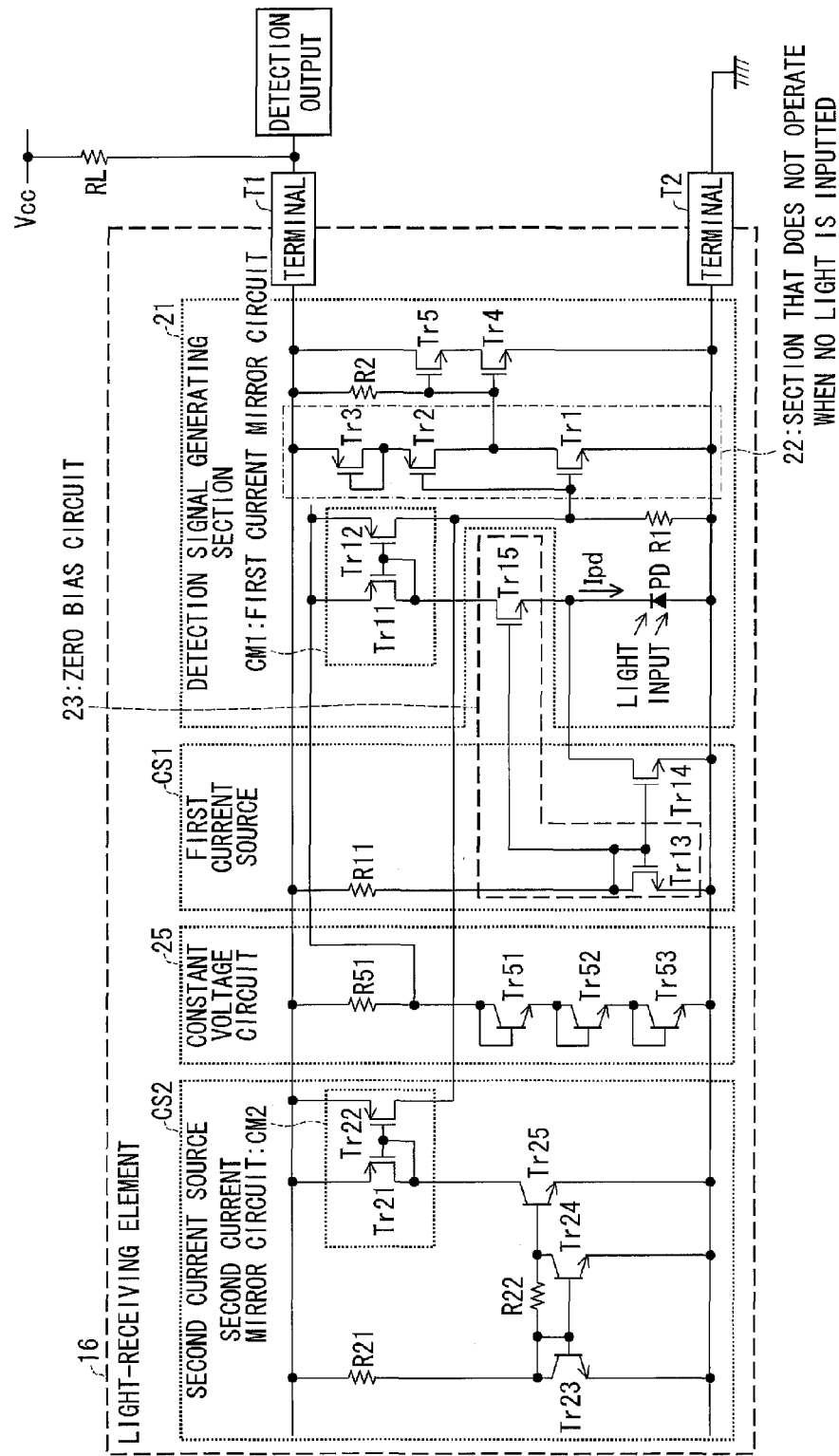

FIG. 11 is a circuit diagram illustrating a light-receiving sensor according to Embodiment 6 of the present invention.

Figure 12:
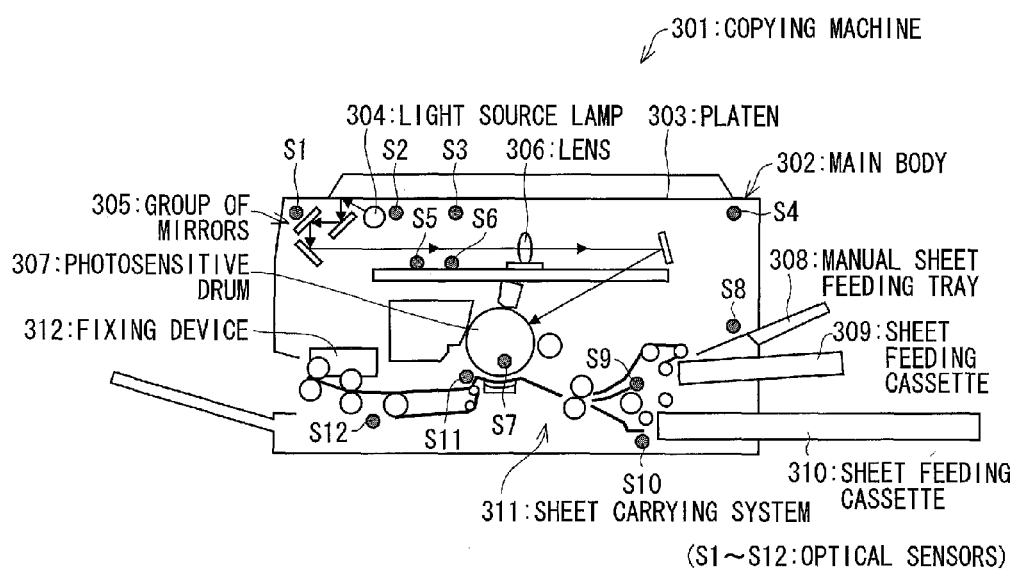

FIG. 12 is an elevation view illustrating an internal configuration of a copying machine according to Embodiment 7 of the present invention.

DESCRIPTION OF EMBODIMENTS

Embodiment 1

The following discusses Embodiment 1 of the present invention with reference to FIG. 1.

FIG. 1 illustrates a circuit diagram of a configuration of a light-receiving sensor according to Embodiment 1.

[Configuration of Light-Receiving Sensor]

As illustrated in FIG. 1, a light-receiving sensor 1 (optical sensor) includes a light-receiving element 11 and an external resistor RL.

The light-receiving element 11 includes two terminals T1 and T2, a detection signal generating section 21, and a first current source CS1. The light-receiving element 11 is a two-terminal light detection circuit that, by changing a circuit current when light is inputted, changes, with respect to a fixed potential of one (T2) of the two terminals, a potential of the other (T1) of the two terminals so as to output a detection signal.

<Configuration of Terminals>

The terminal T1 (first terminal) serves as both an output terminal that outputs the detection signal and a power supply terminal to which a power supply voltage Vcc is applied. The terminal T1 is connected to a power supply line via the external resistor RL. The terminal T2 (second terminal), which is a ground terminal, is connected to a ground line, and is provided with a ground potential (fixed potential).

Note that the terminal T1 may be a terminal which is provided with the fixed potential and the terminal 2 may be a terminal whose potential varies.

The light-receiving element 11 is a circuit that receives light from a light emitting element (not illustrated) directly or indirectly as reflected light from an object, converts the light into an electric signal (detection signal), and then outputs the electric signal.

<Configuration of Detection Signal Generating Section>

The detection signal generating section 21 includes a photodiode PD, resistors R1 and R2, transistors Tr1 to Tr5 (MOS transistors), and a first current mirror circuit CM1.

The photodiode PD is a photoelectric conversion element that, in response to light to be inputted, causes a photocurrent Ipd to flow. The photodiode PD has an anode that is connected to the terminal T2.

Note that the detection signal generating section 21 includes the photodiode PD as the photoelectric conversion element. However, alternatively, the detection signal generating section 21 may include a phototransistor instead of the photodiode PD.

The first current mirror circuit CM1 includes a pair of transistors Tr11 and Tr12 (MOS transistors). The transistor Tr11 on an input side of the first current mirror circuit CM1 has a drain that is connected to a cathode of the photodiode PD and a gate of the transistor Tr11. The transistor Tr11 has a source that is connected to the terminal T1. The transistor Tr12 on an output side of the first current mirror circuit CM1 has a drain that is connected to one end of the resistor R1 and a gate of the transistor Tr1. The transistor Tr12 also has a source that is connected to the terminal T1.

The first current mirror circuit CM1 amplifies a current of an order of nA inputted to the transistor Tr11 and then outputs a current of an order of μA to the transistor Tr12. Therefore, in the first current mirror circuit CM1, a ratio of sizes of the transistor Tr11 and the transistor Tr12 is set in accordance with a current gain.

The other end of the resistor R1 and a source of the transistor Tr1 are connected to the terminal T2. The transistor Tr1 has a drain that is connected to a drain of the transistor Tr2 and a gate of the transistor Tr4. The transistor Tr2 has a source that is connected to a drain of the transistor Tr3 and a gate that is connected to the gate of the transistor Tr1. The transistor Tr1 and the transistor Tr2 form an inverter by thus being connected.

The transistor Tr3 has a source that is connected to the terminal T1 and a gate that is connected the drain of the transistor Tr3. This causes the transistor Tr3 to function as a diode.

The transistor Tr4 (current control section, first transistor) has a source that is connected to the terminal T2 and a drain that is connected to a source of the transistor Tr5. The transistor Tr5 has a drain that is connected to the terminal T1 and a gate that is connected to the gate of the transistor Tr4 and one end of the resistor R2. The other end of the resistor R2 is connected to the terminal T1.

<Configuration of First Current Source>

The first current source CS1 includes a resistor R11 and transistors Tr13 and Tr14 (MOS transistors). The transistors Tr13 and Tr14 are configured by nchMOS transistors identical to those by which the transistors Tr4 and Tr5 are configured.

The transistor Tr13 (second transistor) has a source that is connected to the terminal T2 and a drain that is connected to a gate of the transistor Tr13 and one end of the resistor R11. The other end of the transistor R11 is connected to the terminal T1. The transistor Tr14 has a gate that is connected to the gate of the transistor Tr13. The transistor Tr14 has a source that is connected to the terminal T2 and a drain that is connected to the cathode of the photodiode PD.

The first current source CS1 thus configured is provided in parallel to the photodiode PD.

[Operation of Light-Receiving Sensor]

The following discusses an operation of the light-receiving sensor configured as described above.

<Basic Operation>

When light is inputted, the photodiode PD causes the photocurrent Ipd to flow. This photocurrent Ipd is amplified by the first current mirror circuit CM1 and then flows into the resistor R1, by which the photocurrent Ipd is converted into a voltage.

This causes a variation in potential of the gates of transistors Tr1 and Tr2. Under the circumstances, a resistance value of the resistor R1 is set so that the gate potentials exceed a threshold voltage of the inverter when the photocurrent Ipd is equal to or higher than a predetermined value.

Assume that a current flowing in the resistor R1 is converted into a voltage when light is inputted. In this case, when light exceeding the threshold voltage of the inverter configured by the transistors Tr1 and Tr2 is inputted, the transistor Tr2 is turned off and the transistor Tr1 is turned on. This causes the transistor Tr4 to be off, so that a flow of a current in the transistor Tr4 (current between terminals) stops. This increases a voltage (potential difference) between the terminals T1 and T2 (two terminals).

Meanwhile, in a case where the photocurrent Ipd decreases in accordance with a decrease in amount of input light, the current amplified by the first current mirror circuit CM1 decreases, so that a voltage between terminals of the resistor R1 decreases. When gate-source voltages of the transistors Tr1 and Tr2 decrease to the threshold voltage of the inverter, the transistor Tr2 is turned on while the transistor Tr1 is on. This causes the transistor Tr4 to be on, so that the voltage between the two terminals decreases.

As described above, the voltage between the two terminals increases and decreases in accordance with turning on/off of the transistor Tr4. This causes a detection signal appearing as a detection output at the terminals T1 and T2 to be a high-level voltage when light is inputted, and causes the detection signal to be a low-level voltage when no light is inputted. Specifically, when light is inputted, there merely occurs a small decrease in voltage between the two terminals by the photocurrent Ipd and a drive current of the transistor Tr1. Meanwhile, when no light is inputted, an output current of the light-receiving element 11 is determined in accordance with a drive current of the transistor Tr4, so that a decrease in voltage due to the output current causes the light-receiving element 11 to have a low-level output voltage. A greater voltage difference between a high level and a low level of the output voltage of the light-receiving element 11 allows higher performance of detection, so that an influence of the photocurrent is reduced by setting the drive current of the transistor Tr4 at a high level.

Moreover, when the transistor Tr4 is turned on/off, either of the transistors Tr1 and Tr2 is always turned on. This allows the transistor Tr4 to operate at a higher speed. Consequently, the light-receiving sensor 1 can have a higher response speed.

Moreover, when the transistor Tr4 is turned on/off, the transistor Tr1 is always turned on, or both the transistors Tr1 and Tr2 are turned on. This allows the transistor Tr4 to operate at a higher speed. Consequently, the light-receiving sensor 10 can have a higher response speed.

Note that in the light receiving element 11, it is necessary to switch the transistor Tr2 depending on the voltage between the terminals of the resistor R1. This makes it necessary to reduce a source voltage of the transistor Tr2. That is, it is necessary to prevent the transistor Tr2 from being switched depending on a source-drain voltage of the first current mirror circuit CM1. Therefore, the transistor Tr3 functioning as a diode is provided in series with the transistor Tr2.

This also makes it possible to cause a difference, in accordance with the increase/decrease in voltage between the two terminals, between (a) an operation point of the inverter in a case where the output voltage of the light-receiving element 11 shifts from the high level to the low level and (b) the operation point in a case where the output voltage shifts from the low level to the high level. Therefore, a hysteresis characteristic can be obtained.

<Prevention of Decrease in Response Speed>

As described above, the transistor Tr4 can carry out a switching operation at a high speed in a case where the inverter is formed by the transistors Tr1 and Tr2. However, a small potential difference between the two terminals causes a gradual decrease in potential difference between the gate and the drain of the transistor Tr2 after the switching operation by the transistor Tr4. This causes a decrease in current. As a result, the light-receiving element 11 gradually decreases in response speed.

The resistor R2 is provided in the light-receiving sensor 11 so that such a disadvantage as described above can be avoided. According to this, the decrease in voltage between the two terminals is complemented by the resistor R2. This makes it possible to prevent a decrease in response speed.

Here, in a case where the transistors of the detection signal generating section 21 of the light-receiving element 11 are each configured by a MOS transistor, it is possible to change an operational threshold level of a transistor by regulating a dose. For example, a transistor that generates a current for causing the potential difference between the two terminals (the transistor Tr4 in the light-receiving element 11) is set to have an operation threshold level being lower than 0.7 V. This is because, generally, in a device receiving the detection signal of the light-receiving sensor 1, a threshold level is set to be not lower than 0.7 V that is a diode voltage.

This makes it possible to have a larger potential difference between the two terminals. This consequently makes it possible to widen an operation range of the light-receiving element 11.

<Decrease in Leak Current>

In a case where a transistor having a low threshold level is used in a light-receiving element 11, a leak current may occur when the transistor Tr4 is turned off at a high temperature. In a case where such a leak current occurs, the following disadvantage may occur. That is, in a case where a potential difference between two terminals should increase normally, the potential difference between the two terminals decreases actually.

Under the circumstances, the transistor Tr4 and the transistor Tr5, which are cascade-connected, are provided so that such a disadvantage as described above can be avoided. According to this, by decreasing a drain voltage of the transistor Tr4, a leak current can be reduced to 1/10 or less when the transistor 21 is turned off. This makes it possible to significantly reduce the leak current when the transistor Tr4 is turned off. In particular, the transistor Tr4 carrying out the switching operation needs to be formed in a large size so as to allow a large amount of current to flow therein. Thus, in the transistor Tr4, the leak current is highly likely to be larger accordingly. Consequently, when the potential difference between the two terminals increases, a decrease in potential difference between the two terminals can be prevented.

Here, the transistor Tr1 may malfunction in a case where a threshold level widely varies due to its temperature characteristic. This is because a threshold level of a MOS transistor decreases at a high temperature. Meanwhile, in a case where, for example, a diffused resistor is employed as a resistor for current-voltage conversion, a resistance value increases at a high temperature. This causes a great temperature characteristic in sensitivity.

In order that such a disadvantage can be avoided, the light-receiving element 11 is configured such that the resistor R1 (bias resistor) is made of a resistor (e.g. polysilicon resistor) that has a negative temperature characteristic. This makes it possible to offset the temperature characteristic of the transistor Tr1, which is MOS transistor, and the temperature characteristic of the resistor R1. As a result, a detection output of the light-receiving element 11 can be prevented from varying its temperature characteristic.

Advantageous Effect of Embodiment 1

In a case where the light-receiving sensor 1 operates as described above when light is inputted to the photodiode PD, the terminal T1 has a potential that is substantially identical to the power supply voltage Vcc. Note, however, that a small decrease in voltage occurs by the photocurrent Ipd. Note here that, in a case where light whose amount is not less than a predetermined amount is inputted, an operating current of the transistor Tr12 is limited by a voltage increase in the resistor R1, so that a voltage decrease is limited.

Meanwhile, in a case where the light inputted to the photodiode PD decreases in amount and the light-receiving sensor 1 operates as described above, the voltage between the terminals T1 and T2 (voltage between the terminals) decreases to a voltage determined in accordance with a threshold voltage of the transistor Tr4. As a result, a value of the voltage between the terminals is obtained by subtracting the threshold voltage from the power supply voltage Vcc.

As described above, in a case where switching control is carried out with respect to the transistor Tr4 depending on the photocurrent during a light detection operation, a maximum potential difference between the two terminals is determined in accordance with the threshold voltage of the transistor Tr4. As a result, by decreasing the threshold voltage to 0.5 V or less, the potential difference between the terminals can be set in a wide range obtained by subtracting the threshold voltage (0.5 V or less) from the power supply voltage Vcc (fixed potential).

Moreover, the light-receiving sensor 1 may deteriorate in response characteristic. This is because, when the photocurrent Ipd is turned on/off, a delay in operation occurs due to, for example, a capacitance that the photodiode PD itself has. For solving this problem, the light-receiving sensor 1 is configured such that the first current source CS1 is provided in parallel to the photodiode PD. This allows the first current mirror circuit CM1 to be always supplied with a current, and thus allows an improvement in response characteristic of the light-receiving sensor 1.

Since the first current source CS1 includes the resistor R11 connected to the external resistor RL, the transistors Tr13 and Tr14 are driven by the power supply voltage Vcc via the external resistor RL and the resistor R11. This allows the first current source CS1 to continue operating even when no light is inputted. As a result, the light-receiving sensor 1 can stably carry out a detection operation.

Note that the above effect yielded by the first current source CS1 is described later in detail in accordance with a comparison with a light-receiving sensor 101 described below.

Comparative Example

A comparative example of Embodiment 1 is described below with reference to FIG. 2.

FIG. 2 is a circuit diagram illustrating a configuration of the light-receiving sensor 101 according to the comparative example.

<Configuration of Optical Sensor>

As illustrated in FIG. 2, the light-receiving sensor 101, which includes an external resistor RL as in the case of the light-receiving sensor 1, includes a light-receiving element 102 in place of the light-receiving element 11. The light-receiving element 102, which includes two terminals T1 and T2, and a detection signal generating section 21 as in the case of the light-receiving element 11, further includes a bandgap current source BG.

The bandgap current source BG (auxiliary current source) is provided in parallel to the photodiode PD. The bandgap current source BG includes transistors Tr31 and Tr32 (bipolar transistors), transistors Tr33 to Tr38 (MOS transistors), and a resistor R31.

A circuit constituted by the transistors Tr31 and Tr32 and the resistor R31 generates a bandgap current. The transistor Tr31 has an emitter that is connected to the terminal T2 via the resistor R31 and a collector and a base that are connected to each other. The collector of the transistor Tr31 is connected to the terminal T1 via the transistor Tr33 constituting a current mirror constant current circuit. The transistor Tr32 has an emitter that is connected to the terminal T2 and a collector that is connected to the terminal T1 via the transistor Tr34 constituting the current mirror constant current circuit.

The transistor Tr37 has a source that is connected to the terminal T2 and a drain that is connected to a gate of the transistor Tr37 and to the terminal T1 via the transistor Tr36 constituting the current mirror constant current circuit. The transistors Tr36 and Tr35 constitute the current mirror constant current circuit.

The transistor Tr38 has a source that is connected to the terminal T2, a gate that is connected to the gate of the transistor Tr37, and a drain that is connected to a cathode of the photodiode PD. The transistors Tr37 and Tr38 constitute a current mirror circuit.

The bandgap current source BG configured as described above always supplies, to a first current mirror circuit CM1, a current flowing in the transistor Tr38. According to this, by regulating a minimum value of a voltage between the terminals T1 and T2 (voltage between terminals), even when no light is inputted, the first current mirror circuit CM1 is not completely turned off but is capable of operating. This makes it possible not only to improve photosensitivity but also to improve a speed of an on/off operation in accordance with a light input. This allows a higher response speed of the light-receiving sensor 101.

(Comparison of Operations)

Here, the following description discusses a comparison of operations (simulations) of the light-receiving sensors 1 and 101.

(a) of FIG. 3 is a waveform chart illustrating a waveform of input light and a waveform of a detection signal in accordance with the simulation of the operation of the light-receiving sensor 101. (b) of FIG. 3 is a waveform chart illustrating a waveform of input light and a waveform of a detection signal in accordance with the simulation of the operation of the light-receiving sensor 1.

For example, in a normal operation state (when light of a light-emitting current of 10 mA is inputted), the light-receiving sensor 101 which regulates the switching of the transistor Tr4 by the photocurrent Ipd causes the photocurrent Ipd of 100 nA to flow as a light-receiving current. Meanwhile, when weak light is inputted (when light of a light-emitting current of as small as 0.8 mA is inputted), the light-receiving sensor 101 causes the photocurrent Ipd of approximately 8 nA to flow as the light-receiving current. In this case, the transistor Tr4 is switched when a voltage applied thereto reaches the threshold voltage.

Thus, as illustrated in (a) of FIG. 3, in a case where the light-emitting current is 0.8 mA (800 µA), the light-receiving sensor 101 may repeat an operation such that the detection signal instantly shifts to a high level due to a driving noise of the transistor Tr4, and then returns to a low level after being stable. Such an oscillation (chattering) phenomenon easily occurs, for example, when input light varies, or when input light decreases in amount. This leads to false detection by the light-receiving sensor 101.

The reason for this can be explained as below.

Assume, for example, that in the light-receiving sensor 101, threshold voltages of the transistors Tr4 and Tr5 that operate when the voltage between the terminals T1 and T2 is at a low level are as low as 0.5 V or less when no light is inputted. In this case, as illustrated in (a) of FIG. 3, the voltage of the detection signal (low-level voltage) appearing between the terminals T1 and T2 is also as low as 0.5 V or less.

Moreover, since the transistors Tr31 and Tr32 are bipolar transistors, the bandgap current source BG requires 0.7 V as base-emitter voltages VBE of the transistors Tr31 and Tr32. Thus, when no light is inputted, a section 103 including not only the bandgap current source BG but also the photodiode PD, the first current mirror circuit CM1, the resistor R1, and the transistors Tr1 to Tr3 does not operate in the light-receiving sensor 101.

In a state in which such a small photocurrent Ipd is flowing, an instant noise component that is generated when the first current mirror circuit CM1 starts operating appears at the terminal T1 via the sources of the transistors Tr11 and Tr12 of the first current mirror circuit CM1. This causes a state in which the terminal T1 is instantly stabilized at a high level, so that malfunction of a detection operation is caused. Thereafter, a decrease in switching noise of the transistor Tr4 reduces the detection signal to a low level, so that the section 103 that does not operate when no light is inputted stops operating again, and the first current mirror circuit CM1 is also turned off. In a case where the above operation is repeated due to the small photocurrent Ipd, a signal oscillation phenomenon occurs.

For solving the above problem, in the light-receiving sensor 1, the first current source CS1 includes the transistors Tr13 and Tr14 configured by nchMOS transistors identical to those by which the transistors Tr4 and Tr5 are configured. This allows threshold voltages (operation voltages) of the transistors Tr13 and Tr14 to be identical to those of the transistors Tr4 and Tr5. Thus, the first current source CS1 is driven by the power supply voltage Vcc via the external resistor RL even in a case where the detection signal appearing at the terminals T1 and T2 is at a low level. Therefore, the first current mirror circuit CM1, to which a current is supplied from the first source CS1, can continue operating. In this state, only the section 22 that does not operate when no light is inputted, the section including the transistors Tr1 to Tr3, is not operating in the light-receiving sensor 1.

Hence, according to the light-receiving sensor 1, in a case where the light-emitting current is 0.8 mA (800 µA), the first current mirror circuit CM1 continues operating even if the detection signal instantly shifts to the high level due to the driving noise of the transistor Tr4 (see (b) of FIG. 3). This allows a reduction in switching noise of the first current mirror circuit CM1. As a result, an oscillation phenomenon is prevented as illustrated in (b) of FIG. 3, so that the light-receiving sensor 1 of Embodiment 1 is useful.

Modified Example

A modified example of Embodiment 1 is described below with reference to FIG. 4.

FIG. 4 is a circuit diagram illustrating a configuration of a light-receiving sensor 1A according to a modified example of Embodiment 1.

<Configuration of Light-Receiving Sensor>

As illustrated in FIG. 4, a light-receiving sensor 1A, which includes an external resistor RL as in the case of the light-receiving sensor 1, includes a light-receiving element 11A in place of the light-receiving element 11. The light-receiving element 11A, which includes two terminals T1 and T2, and a detection signal generating section 21 as in the case of the light-receiving element 11, further includes a first current source CS11 in place of the first current source CS1.

The first current source CS11 includes a resistor R12, and transistors Tr16 and Tr17 (pch MOS transistors).

The transistor Tr16 (second transistor) has a source that is connected to the terminal T1 and a drain that is connected to a gate of the transistor Tr16 and to one end of the resistor R12. The other end of the transistor R12 is connected to the terminal T2. The transistor Tr17 has a gate that is connected to the gate of the transistor Tr16. The transistor Tr17 has a source that is connected to the terminal T1 and a drain that is connected to one end of a resistor R1 and to a gate of a transistor Tr1 as in the case of a drain of a transistor Tr12 of a first current mirror circuit CM1.

The first current source CS11 thus configured is provided in parallel to the first current mirror circuit CM1.

According to the light-receiving sensor 1A configured as described above, the first current source CS11 is provided in parallel to the first current mirror circuit CM1. This allows the resistor R1 (voltage conversion resistor) to be always supplied with a current, and thus allows an improvement in response characteristic of the light-receiving sensor 1 as in the case of the first current source CS1.

Since the first current source CS11 includes the resistor R12 connected to the external resistor RL via the transistor Tr16, the transistors Tr16 and Tr17 are driven by the external resistor RL and the resistor R12 at a power supply voltage Vcc. This allows the first current source CS11 to continue operating even when no light is inputted. As a result, a variation in voltage occurring in the resistor R1 can be prevented even if a switching noise occurs in the first current mirror circuit CM1. This allows the light-receiving sensor 1A to stably carry out a detection operation.

Embodiment 2

The following discusses Embodiment 2 of the present invention with reference to FIG. 5.

FIG. 5 is a circuit diagram illustrating a configuration of a light-receiving sensor 2 according to Embodiment 2.

Note that in Embodiment 2, components having functions identical to those of the respective components described in Embodiment 1 are given respective identical reference numerals, and a description of those components is omitted here.

In order to improve in response characteristic, the light-receiving sensor 1 described above is configured such that the first current source CS1 is provided in parallel to the photodiode PD. However, in such a configuration, a photosensitivity characteristic of the light-receiving sensor 1 varies due to a variation in current of the first current source CS1. This may cause the light-receiving sensor 1 to be lower in signal response speed.

For solving the above problem, by always setting a bias between an anode and a cathode of the photodiode PD at zero, Embodiment 2 is configured so as not to be influenced by the current of the first current source CS1.

[Configuration of Light-Receiving Sensor]

As illustrated in FIG. 5, the light-receiving sensor 2 (optical sensor) includes a light-receiving element 12 and an external resistor RL.

The light-receiving element 12 includes two terminals T1 and T2, a detection signal generating section 21, and a first current source CS1 as in the case of the light-receiving element 11 of the light-receiving sensor 1. The light-receiving element 12 further includes a zero bias circuit 23.

The zero bias circuit 23 (zero bias section) includes transistors Tr13 and Tr15. The transistor Tr15 has a drain that is connected to a drain of a transistor Tr11 of a first current mirror circuit CM1. The transistor Tr15 has a source that is connected to a cathode of a photodiode PD and a drain of a transistor Tr14. The transistor Tr15 has a gate that is connected to a gate of the transistor Tr13 of the first current source CS1. Further, the gates of the transistors Tr13 and Tr15 are connected to each other, so that a current mirror circuit is formed.

[Operation of Light-Receiving Sensor]

In the light-receiving sensor 2 configured as described above, a potential of a source of the transistor Tr13 is a GND potential (ground potential). Potentials of the gates of the transistors Tr13 and Tr15 are gate potentials. This causes a potential of the source of the transistor Tr15 to be the GND potential.

Therefore, a potential difference between the anode and the cathode of the photodiode PD becomes 0. Further, in the transistor Tr15, a source signal directly becomes a drain signal. Therefore, there is no problem in signal transmission.

Advantageous Effect of Embodiment 2

As described above, in the light-receiving sensor 2, the zero bias circuit 23 sets a bias voltage of the photodiode PD at zero. According to this, the photodiode PD does not need to charge a capacitance thereof even when a photocurrent Ipd flows therein. This allows a higher signal response speed of the light-receiving sensor 2. Therefore, the configuration of Embodiment 2 is desirable.

The first current source CS1 and the zero bias circuit 23 share the transistor Tr13. This makes it possible not only to prevent a larger circuit scale but also to achieve compatibility of a current supply capability between the zero bias circuit 23 and the first current source CS1. This allows a reduction in variation in current caused by a power supply voltage Vcc and/or temperature dependency. As a result, it is useful that the light-receiving sensor 2 includes the zero bias circuit 23.

Moreover, in a case where the zero bias circuit 23 is provided on a cathode side of the photodiode PD, and the source of the transistor Tr15 and the drain of the transistor Tr14 are connected to each other, it is possible to supply, also to the transistor Tr14, a current flowing in the transistor Tr15. This allows the first current source CS1 to be driven even when there is no photocurrent Ipd. Consequently, since an on-state of the first current source CS1 is maintained regardless of presence of a light input, switching of the transistor Tr15 is carried out fewer times, so that a switching noise of the transistor Tr15 can be reduced.

Embodiment 3

The following discusses Embodiment 3 of the present invention with reference to FIG. 6.

FIG. 6 is a circuit diagram illustrating a configuration of a light-receiving sensor 3 according to Embodiment 3.

Note that in Embodiment 3, components having functions identical to those of the respective components described in Embodiments 1 and 2 are given respective identical reference numerals, and a description of those components is omitted here.

[Configuration of Light-Receiving Sensor]

As illustrated in FIG. 6, the light-receiving sensor 3 (optical sensor) includes a light-receiving element 13 and an external resistor RL.

The light-receiving element 13 includes two terminals T1 and T2, a detection signal generating section 21, and a first current source CS1 as in the case of the light-receiving sensor 1. The light-receiving element 13 further includes a bandgap current source BG as in the case of the light-receiving element 102 of the light-receiving sensor 101.

Advantageous Effect of Embodiment 3

<Effect of Bandgap Current Source>

The bandgap current source BG can generate a current that does not depend on an external power supply voltage (power supply voltage Vcc). The following explains the reason for this.

A value of a current I2 (second auxiliary current) generated by the bandgap current source BG is determined by transistors Tr31 and Tr32 that generate a bandgap voltage, and a resistor R31. Here, in a case where a ratio of sizes of the transistors Tr31 and Tr32 that are bipolar transistors is 2:1, a relation between a base-emitter voltage VBE1 of the transistor Tr31 and a base-emitter voltage VBE2 of the transistor Tr32 is expressed in the following formula.

$$VBE1+R\times Ir=VBE2$$

$$VT\times \ln(Ir/2Is)+R\times Ir=Vt\times \ln(Ir/Is)$$

where: R is a resistance value of the resistor R31; Ir is a value of a reference current flowing in the transistor Tr31; and Is is a value of a saturation current. Note that Vt is expressed as Vt=kT/q where k is Boltzmann constant, q is an elementary charge, and T is an absolute temperature.

The above formula allows the reference current value Ir of the bandgap current source BG to be expressed as below.

$$Ir=Vt\times \ln 2/R$$

where Vt is 26 mV at a normal temperature. Accordingly, in a case where a value of R is 10 kΩ, the reference current Ir is 1.8 µA.

The above formula does not include the power supply voltage Vcc (external power supply voltage). This means that the reference current value Ir does not depend on the power supply voltage Vcc. Further, regarding a temperature characteristic, since Vt varies at −2 mV/° C., dependency of the reference current value Ir on temperature can be prevented by using, as the resistor R31, a device having a negative temperature characteristic (temperature coefficient).

As described above, the reference current generated by the bandgap current source BG does not depend on the power supply voltage Vcc. This allows the light-receiving element 13 to stably detect light without being influenced by the variation in power supply voltage Vcc.

In contrast, in a case where a current source in which a current value depends on the power supply voltage Vcc is used, a current of the current source varies due to a variation in power supply voltage Vcc. Thus, in a case where the current of the current source increases when, for example, the power supply voltage Vcc is equal to or higher than a predetermined value, even though no light is detected, a detection output identical to that obtained when light is detected is obtained (error detection).

Moreover, the light-receiving sensor 3 can be provided with a hysteresis characteristic by using the bandgap current source BG. Further, a hysteresis band can be regulated by regulating an amount of the current I2 in the bandgap current source BG. Since the amount of the current I2 in the bandgap current source BG is determined by the resistance value of the resistor R31 as described above, the hysteresis band is set at a desired value by appropriately setting the resistance value.

Assume, for example, that the amount of the current I2 is 2 nA with respect to a photocurrent of 10 nA. Further, when a voltage between the two terminals T1 and T2 reaches a minimum, the bandgap current source BG is turned off, and thus the current I2 becomes 0 A accordingly. In such a case, each of a maximum potential difference (Vmax) between the two terminals and a minimum potential difference (Vmin) between the two terminals is proportional to a value obtained by subtracting the current I2 from the photocurrent Ipd. Therefore, a ratio R (hysteresis) of Vmax and Vmin is expressed in the following formula.

$$R = Vmax/Vmin$$
$$= (10-2)/(10-0)$$
$$= 80\%$$

By thus appropriately regulating the amount of the current I2, a photocurrent amount required for changing a detection signal from a low-level state to a high-level state becomes different from a photocurrent amount required for changing the detection signal from the high-level state to the low-level state. This makes it possible to obtain the hysteresis characteristic. This also reduces dependency of the hysteresis band on the resistance value, so that the resistance value of the external resistor RL can be used in a wider range. This makes it possible to eliminate influence of a variation in latter-stage amplifier and influence of changes in temperature and voltage.

<Effect Yielded by Bandgap Current Source and First Current Source>

The bandgap current source BG uses the transistors Tr31 and Tr32 configured by bipolar transistors as described above. Accordingly, a voltage of approximately 0.7 V at minimum is required as the base-emitter voltages VBE1 and VBE2. Therefore, as described above, in a case where threshold voltages of the transistors Tr4 and Tr5 are configured to be equal to or less than 0.5 V so as to drive the light-receiving element 13 at a low-level voltage, the bandgap current source BG cannot be driven. As a result, the bandgap current source BG can be driven only in a state in which the detection signal of the light-receiving element 13 is at a high-level voltage.

Meanwhile, the first current source CS1, to which the power supply voltage Vcc is applied via the resistor R11, can be driven even in a state in which the detection signal is at a low level. However, a variation in current occurs in the first current source CS1 due to dependency on the power supply voltage Vcc and on temperature.

Therefore, in a case where the bandgap current source BG and the first current source CS1 are used in combination, a hysteresis characteristic HYS of the light-receiving element 13 is determined by the following formula.

$$HYS=(I1\text{off}+Ipd)/(I1\text{on}+I2+Ipd)$$

where: I1off is a value of a state in which no light of a current I1 (first auxiliary current) flowing in the first current source CS1 is inputted; and I1on is a value of a state when light of the current I1 is inputted. Note that I2 is a value of the current I2 flowing in the bandgap current source BG.

Consequently, it is useful that the first current source CS1 and the bandgap current source BG are used in combination in the light-receiving sensor 3.

Embodiment 4

The following discusses Embodiment 4 of the present invention with reference to FIG. 7.

FIG. 7 is a circuit diagram illustrating a configuration of a light-receiving sensor 4 according to Embodiment 4.

Note that in Embodiment 4, components having functions identical to those of the respective components described in Embodiments 1 and 2 are given respective identical reference numerals, and a description of those components is omitted here.

[Configuration of Light-Receiving Sensor]

As illustrated in FIG. 7, the light-receiving sensor 4 (optical sensor) includes a light-receiving element 13 and an external resistor RL.

The light-receiving element 13 includes two terminals T1 and T2, a detection signal generating section 21, a zero bias circuit 23, and a first current source CS1 as in the case of the light-receiving element 12 of the light-receiving sensor 2. The light-receiving element 13 further includes a second current source CS2.

<Configuration of Second Current Source>

The second current source CS2 includes a second current mirror circuit CM2, resistors R21 and R22, and transistors Tr23 to Tr25 (npn bipolar transistors).

The second current mirror circuit CM2 includes a pair of transistors Tr21 and Tr22 (MOS transistors). The transistor Tr21 on an input side of the second current mirror circuit CM2 has a drain that is connected to a collector of the transistor Tr25 and a gate of the transistor Tr21. The transistor Tr21 has a source that is connected to the terminal T1. The transistor Tr22 on an output side of the second current mirror circuit CM2 has a drain that is connected to one end of a transistor R1 and a gate of a transistor Tr1 as in the case of a drain of a transistor Tr12 of a current mirror circuit CM1 (described above). The transistor Tr22 also has a source that is connected to the terminal T1.

In the second current mirror circuit CM2, a ratio of sizes of the transistors Tr21 and Tr22 is set so as to amplify a current inputted to the transistor Tr21 and then output a current of an order of μA to the transistor Tr22.

The transistor Tr23 has a collector that is connected to the terminal T1 via the resistor R21 and an emitter that is connected to the terminal T2. The transistor Tr23 has the collector and a base that are both connected to a base of the transistor Tr24 and one end of the resistor R22. The other end of the resistor R22 is connected to a collector of the transistor Tr24 and a base of the transistor Tr25. The transistor Tr25 has an emitter that is connected to the terminal T2.

[Operation of Light-Receiving Sensor]

In the light-receiving sensor 4 configured as described above, a current of an order of nA of the first current source CS1 flows into a transistor Tr11 of the first current mirror circuit CM1. Meanwhile, a current of the second current resource CS2 flows into the transistor Tr12 of the first current mirror circuit CM1.

In the second current resource CS2, a circuit configured by the resistor R22 and the transistors Tr23 to Tr25 generates a current by being driven by the power supply voltage Vcc via the external resistor RL and the resistor R21. This current, which flows through the transistor Tr21 in the second current mirror circuit CM2, is amplified and then is outputted to the transistor Tr22. According to this, the current of the order of μA (additional current) generated by the second current source CS2 flows into the transistor Tr12 of the first current mirror circuit CM1.

Assume that threshold voltages of the transistors Tr4 and Tr5 that operate when a voltage between the terminals T1 and T2 is at a low level are as low as 0.5 V or less when no light is inputted. In this case, a voltage of a detection signal (low-level voltage) appearing between the terminals T1 and T2 is also as low as 0.5 V or less.

Meanwhile, since the transistors Tr23 to Tr25 are bipolar transistors, the second current source CS2 requires 0.7 V as base-emitter voltages VBE of the transistors Tr23 to Tr25. Thus, when no light is inputted, the second current source CS2 does not operate.

[Effect of Light-Receiving Sensor]

<Improvement in Variation in Output Current>

In the light-receiving sensor 3 described above, use of the first current source CS1 and the bandgap current source BG causes the current I1 of the first current source CS1 and the current I2 of the bandgap current source BG together with the photocurrent Ipd to flow into the first current mirror circuit CM1. This causes an output current of the first current mirror circuit CM1 to be influenced by a variation in current gain of the first current mirror circuit CM1.

Since a value of the photocurrent Ipd is normally an order of nA, not only the photocurrent Ipd but also the current I2 flowing in the first current mirror circuit CM1 is required to be the order of nA. This causes a great variation in output current of the first mirror circuit CM1, so that the variation is difficult to regulate within a permissible range.

Meanwhile, a value of the output current of the first current mirror circuit CM1 is the order of μA. Therefore, in the light-receiving sensor 4, the variation in output current of the first current mirror circuit CM1 can be regulated within the permissible range by causing the second current source CS2 to supply the current of the same order of μA to the output side of the current mirror circuit CM1.

As described above, it is useful that the light-receiving sensor 4 has the second current source CS2.

<Correction of Temperature Characteristic of Hysteresis>

(a) of FIG. 8 is a graph showing a result of a simulation of a characteristic of a base-emitter voltage of a transistor with respect to a temperature in the second current source CS2. (b) of FIG. 8 is a graph showing a result of a simulation of a characteristic of a current with respect to the base-emitter voltage of the transistor of second current source CS2. FIG. 9 is a graph showing a result of a simulation of a hysteresis characteristic with respect to a temperature of the light-receiving sensor 4.

In a case where base-emitter voltages of the transistors Tr23 and Tr24 are VBEa and a base-emitter voltage of the transistor Tr25 is VBEb, the base-emitter voltage VBEb decreases with respect to the base-emitter voltages VBEa by a voltage decrease caused by the resistor R22. In this case, a decreased voltage is regarded as a value in accordance with a small base current of the transistor Tr25 and is substantially expressed by a collector current value Ic24 of the transistor 24. Accordingly, the decreased voltage is expressed by Ic24×R22 (where R22 indicates the resistor R22).

The collector current value Ic24 is half a current flowing in the resistor R21. Here, in a case where a maximum value of the voltage between the terminals T1 and T2 is VOH and a resistance value of the resistor R21 is R21, the collector current value Ic24 is expressed by the following formula.

$$Ic24=(VOH-VBEa)/(2\times R21)$$

Therefore, a decreased voltage VBEdrop, which is a decreased amount of the base-emitter voltage VBEb with respect to the base-emitter voltages VBEa, is expressed by the following formula.

$$VBEdrop = VBEa - VBEb$$
$$= Ic24 \times R22$$
$$= (VOH + VBEa) \times R22/2R21$$

The above formula shows that the base-emitter voltage VBEb can be regulated by regulating resistance values of the resistors R21 and R22. Moreover, as illustrated in (a) of FIG. 8, the base-emitter voltages VBEa and VBEb have a negative temperature characteristic.

In this regard, in a case where the base-emitter voltage VBEb is regulated so as to be decreased by regulating the resistance values of the resistors R21 and R22, it is possible to regulate a temperature characteristic of a collector current of the transistor Tr25 as shown in (b) of FIG. 8. (b) of FIG. 8 shows that collector currents of the transistors Tr23 and Tr24 have the negative temperature characteristic while the collector current of the transistor Tr25 is regulated so as to have a positive temperature characteristic.

This makes it possible to correct the temperature characteristic of the hysteresis characteristic HYS of the light-receiving sensor 4.

As illustrated in FIG. 9, the light-receiving sensor 1 using only the first current source 1 has a greater hysteresis characteristic at a higher temperature, so that the light-receiving sensor 1 has a positive temperature characteristic. In contrast, the light-receiving sensor 4 using the first current source CS1 and the second current source CS2 in combination less increases in hysteresis characteristic at a higher temperature, so that the light-receiving sensor 4 has a hysteresis characteristic that less depends on temperature than the hysteresis characteristic of the light-receiving sensor 1.

Embodiment 5

The following discusses Embodiment 5 of the present invention with reference to FIG. 10.

FIG. 10 is a circuit diagram illustrating a configuration of a light-receiving sensor 5 according to Embodiment 5.

Note that in Embodiment 5, components having functions identical to those of the respective components described in Embodiments 1 to 4 are given respective identical reference numerals, and a description of those components is omitted here.

[Configuration of Light-Receiving Sensor]

As illustrated in FIG. 10, a light-receiving sensor 5 (optical sensor) includes a light-receiving element 15 and an external resistor RL.

The light-receiving element 15 includes two terminals T1 and T2, a detection signal generating section 21, a zero bias circuit 23, a first current source CS1, and a second current source CS2 as in the case of the light-receiving element 14 of the light-receiving sensor 4. The light-receiving element 15 further includes a constant voltage circuit 24.

<Configuration of Constant Voltage Circuit>

The constant voltage circuit 24 includes a resistor R41 and a capacitor C. The resistor R41 has one end that is connected to the terminal T1 and the other end that is connected to one electrode of the capacitor C. The other electrode of the capacitor C is connected to the terminal T2. The capacitor C has a capacitance that allows a constant voltage to be maintained when a voltage between the terminals T1 and T2 reaches a maximum.

A joint of the resistor R41 and the capacitor C is connected to sources of transistors Tr11 and Tr12 of a first current mirror circuit CM1.

[Operation of Light-Receiving Sensor]

In the light-receiving sensor 5 configured as described above, the capacitor C is charged via the resistor R41 by a potential difference between the terminals T1 and T2. In addition, the capacitor C has the capacitance that allows constant voltage to be maintained when the voltage between the terminals T1 and T2 reaches the maximum. This allows the constant voltage to be maintained in the capacitor C when the potential difference between the terminals T1 and T2 reaches the maximum.

The first current mirror circuit CM1 which is applied with the constant voltage causes a current to flow to an output side thereof in accordance with a current flowing in an input side thereof.

[Effect of Light-Receiving Sensor]

Since the light-receiving sensor 5 includes the constant voltage circuit 24, the constant voltage is maintained in the capacitor C when the voltage between the terminals T1 and T2 reaches the maximum. This allows the first current mirror circuit CM1 to be driven at a stable constant voltage without being influenced by a variation in power supply voltage Vcc. Thus, it is possible to further prevent a switching noise in the first current mirror circuit CM1. Consequently, the light-receiving sensor 5 can further prevent the oscillation phenomenon described above than the light-receiving sensor 1.

Embodiment 6

The following discusses Embodiment 6 of the present invention with reference to FIG. 11.

FIG. 11 is a circuit diagram illustrating a configuration of a light-receiving sensor 6 according to Embodiment 6.

Note that in Embodiment 6, components having functions identical to those of the respective components described in Embodiments 1 to 4 are given respective identical reference numerals, and a description of those components is omitted here.

[Configuration of Light-Receiving Sensor]

As illustrated in FIG. 11, the light-receiving sensor 6 (optical sensor) includes a light-receiving element 16 and an external resistor RL.

The light-receiving element 16 includes two terminals T1 and T2, a detection signal generating section 21, a zero bias circuit 23, a first current source CS1, and a second current source CS2 as in the case of the light-receiving element 14 of the light-receiving sensor 4. The light-receiving element 16 further includes a constant voltage circuit 25.

<Configuration of Constant Voltage Circuit>

The constant voltage circuit 25 includes a resistor R51 and transistors Tr51 to Tr53 (npn bipolar transistors). The resistor R51 has one end that is connected to the terminal T1 and the other end that is connected to a collector of the transistor Tr51. The transistors Tr51 to Tr53, each of which has a base and a collector that are connected with each other, function as diodes. An emitter of the transistor Tr51 is connected to the collector of the transistor Tr52, and an emitter of the transistor Tr52 is connected to the collector of the transistor Tr53. An emitter of the transistor Tr53 is connected to the terminal T2.

A joint of the resistor R51 and the transistor Tr51 is connected to sources of transistors Tr11 and Tr12 of a first current mirror circuit CM1.

[Operation of Light-Receiving Sensor]

In the light-receiving sensor 6 configured as described above, in a case where transistors Tr4 and Tr5 are turned off when light is inputted, a potential difference between the terminals T1 and T2 reaches a maximum. In this case, a constant voltage appears at both ends of a series circuit of the diodes configured by the transistors Tr51 to Tr53 (between the resistor R51 and the transistor Tr51). This causes the constant voltage to appear at both ends of the series circuit.

The first current mirror circuit CM1 which is applied with the constant voltage stably causes a current to flow to an output side thereof in accordance with a current flowing in an input side thereof.

[Effect of Light-Receiving Sensor]

<Effect Yielded by Diode>

Since the light-receiving sensor 6 includes the constant voltage circuit 25, when the voltage between the terminals T1 and T2 reaches the maximum, the constant voltage is obtained at both ends of the series circuit of the diodes configured by the transistors Tr51 to Tr53. This allows the first current mirror circuit CM1 to be driven at a stable constant voltage without being influenced by a variation in power supply voltage Vcc. Thus, it is possible to further prevent a switching noise in the first current mirror circuit CM1. Consequently, the light-receiving sensor 6 can further prevent the oscillation phenomenon described above than the light-receiving sensor 1.

Note here that the constant voltage circuit 25 whose number is three as described above is desirable because the constant voltage circuit 25 allows a detection signal to be maintained at a high level when the potential difference between the terminals T1 and T2 reaches the maximum (see (b) of FIG. 3).

More diodes of the constant voltage circuit 25 allow a higher voltage to be applied to the transistors Tr11 and Tr12 of the first current mirror circuit CM1. This allows source-drain voltages of the transistors Tr11 and Tr12 to be at a high level, so that the transistors Tr11 and Tr12 can be prevented from being unsaturated. However, the configuration prevents the first current mirror circuit CM1 from operating at a low voltage.

On the contrary, fewer diodes of the constant voltage circuit 25 allow the first current circuit CM1 to operate at a lower voltage. However, it is difficult to prevent the transistors Tr11 and Tr12 from being unsaturated.

Consequently, the constant voltage circuit 25 which includes three diodes not only allows the first current mirror circuit CM1 to operate at a low voltage but also prevents the transistors Tr11 and Tr12 from being unsaturated. Therefore, the light-receiving sensor 6, which can sufficiently stably operate also at a 3V-system power supply voltage Vcc, is useful.

<Effect Yielded by Resistor>

A lower bias voltage (bias voltage closer to a forward bias) of a photodiode PD allows the photodiode PD to have a larger capacitance. This causes a variation in response of the light-receiving element 16.

For solving the above problem, in the light-receiving sensor 6, the constant voltage circuit 25 applies a voltage between the terminals T1 and T2 (voltage between terminals) to the transistors Tr51 to Tr53 via the resistor R51. According to this, in a case where the voltage between the terminals shifts from a low level to a high level, a bias voltage Vpd of the photodiode PD is expressed as below based on a driving voltage VL of the transistor Tr4 (low-level voltage between the terminals).

$$Vpd = VL - (VGS11 + VDS15 + R51 \times Icm)$$

where: VGS11 is a gate-source voltage of the transistor Tr11; VDS15 is a drain-source voltage of a transistor Tr15; R51 is a resistance value of the transistor R51; and Icm is an output current of the first current mirror circuit CM1.

Note here that, in a case where VL=0.35 V, VGS11=0.25 V, VDS 15=0.05 V, R51=30 kΩ, and Icm=30 nA, the bias voltage Vpd is obtained as below based on the above formula.

$$Vpd = 0.35 \text{ V} - (0.25 \text{ } V + 0.05 \text{ V} + 30 \text{ } k\Omega \times 30 \text{ nA})$$

$$= 0.35 \text{ V} - (0.25 \text{ } V + 0.05 \text{ V} + \text{approx. } 0.001 \text{ V})$$

$$\approx 0.05 \text{ V}$$

Note that the driving voltage VL is determined in accordance with a threshold voltage of the transistor Tr4, and the bias voltage Vpd is determined in accordance with a design specification of an external circuit. This makes it necessary to design the external circuit so as to prevent a decrease in bias voltage Vpd and a delay in response.

As described above, use of the resistor R51 in the constant voltage circuit 25 makes it possible to more easily secure the bias voltage of the photodiode PD than use of, for example, a transistor. Therefore, the light-receiving sensor 6, which includes the current voltage circuit 25 including the resistor R51, can have a higher response speed, so that the light-receiving sensor 6 thus configured is useful.

Embodiment 7

The light receiving sensors 1 to 6 described in Embodiments 1 to 6 are suitably applied to, for example, electronics devices such as a digital camera using a photo interrupter, a copying machine, a printer, and a portable device. Further, the light-receiving sensors 1 to 6 are also suitably applied to a smoke sensor, a proximity sensor, a range sensor, and the like for each of which a sufficient capacity cannot be ensured. Each of the smoke sensor, the proximity sensor, and the range sensor can be configured by a detector employing a light-emitting element and a light-receiving element. The smoke sensor detects a change in sensitivity depending on an amount of smoke that blocks light between the light-emitting element and the light-receiving element. Meanwhile, each of the proximity sensor and the range sensor causes the light-receiving element to detect an amount of light that has been emitted from the light-emitting element and reflected by a detection target object. Therefore, by applying the light-receiving sensors 1 to 6 to any of the above sensors, low-voltage driving through fewer terminals becomes possible. Therefore, the present invention is useful.

Further, as described above, the light-receiving sensors 1 to 6 can sufficiently decrease a voltage between terminals and can prevent an oscillation phenomenon. According to this, by applying the light-receiving sensors 1 to 6 to any of the above sensors, it is possible to sharply change a detection signal obtained when light is blocked and the detection signal obtained when no light is blocked, and it is unnecessary to prevent, by use of a low pass filter, a chattering signal caused by oscillation. This makes it possible to carry out accurate sensing, so that application of the light-receiving sensors 1 to 6 is useful.

[Configuration of Copying Machine]

Here, the following explains a copying machine as a specific example of an electronics device that employs an optical sensor. FIG. 12 is a front view illustrating an internal configuration of the copying machine 301.

As illustrated in FIG. 12, in a copying machine 301, a document placed on a platen 303 provided in an upper section of a main body 302 is irradiated with light of a light source lamp 304. Then, light reflected from the document is thrown onto a charged photosensitive drum 307 via a group of mirrors 305 and a lens 306 and thereby an exposure process is carried out. Further, the copying machine 301 adheres toner onto a static latent image that is formed on the photosensitive drum 307 by the exposure process. As a result, a toner image is formed. Further, the copying machine 301 transfers the toner image on the photosensitive drum 307 onto a sheet supplied via a sheet carrying system 311 from a manual sheet feeding tray 308 or a sheet feeding cassette 309 or 310. Subsequently, the toner image is fixed in a fixing device 312 and then the sheet is discharged to the outside of the main body 302.

In the copying machine 301 configured as described above, for detecting a position of each section or detecting passage of a sheet, optical sensors S1 to S12 are provided.

The optical sensors S1 to S4 are provided for detecting a position of a part of the group of mirrors 305 that move in a light scanning direction of the document. The optical sensors S5 and S6 are provided for detecting a position of the lens 306 that moves together with the part of the group of mirrors 305. The optical sensor S7 is provided for detecting a rotational position of the photosensitive drum 307.

The optical sensor S8 is provided for detecting the presence of a sheet on the manual sheet feeding tray 308. The optical sensor S9 is provided for detecting the presence of a sheet that has been fed from the upper sheet feeding cassette 309 and that is being carried. The optical sensor S10 is provided for detecting the presence of a sheet that has been fed from the lower sheet feeding cassette 310 and that is being carried.

The optical sensor 11 is provided for detecting separation of a sheet from the photosensitive drum 307. Further, the optical sensor S12 is provided for detecting discharge of a sheet to the outside of the copying machine 301.

As described above, the copying machine 301 includes many optical sensors S1 to S12. By using the light-receiving sensors 1 to 6 of any of Embodiments described above as these optical sensors S1 to S12, a function of the copying machine 301 can be enhanced by the optical sensors S1 to S12.

Note that, for convenience of explanation, the optical sensors S1 to S12 are explained as examples above. However, in an actual copying machine, a larger number of optical sensors are often used. Therefore, in such an electronics device, the above-described effects become more prominent.

CONCLUSION

An optical sensor according to an aspect of the present invention is an optical sensor (any one of the light-receiving sensors 1 through 6, and 1A) that has two terminals and detects a light input by changing, with respect to a fixed potential of a first terminal (the terminal T2) of the two terminals, a potential of a second terminal (the terminal T1) of the two terminals to which second terminal a power supply voltage (the power supply voltage Vcc) is applied, the optical sensor including: a photoelectric conversion element (the photodiode PD) for generating a photocurrent (the photocurrent Ipd) by use of the light input; a first current source (the first current source CS1 or CS11) for generating a first auxiliary current by being driven by a voltage between terminals, which are the first terminal and the second terminal; a current amplifier for amplifying the photocurrent; a current control section (the transistor Tr4) for stopping a current between the terminals, which are the first terminal and the second terminal, in accordance with an output current that is outputted from the current amplifier when light is inputted, and causing the current between the terminals to flow in accordance with an output current that is outputted from the current amplifier when no light is inputted, the first current source generating the first auxiliary current regardless of presence of the light input either by inputting the first auxiliary current to the current amplifier or by adding the first auxiliary current to the output current of the current amplifier.

In the above configuration, when no light is inputted, the current control section causes the current between the terminals, which are the first terminal and the second terminal, to flow. Therefore, the potential of the second terminal comes closer to the fixed potential of the first terminal, so that the voltage between the terminals decreases to a low level. Meanwhile, when light is inputted to a light-receiving element, the current control section stops the current between the terminals. Therefore, the potential of the second terminal is maintained by a potential determined in accordance with the power supply voltage without coming closer to the fixed potential of the first terminal, so that the voltage between the terminals is at a high level. In this case, the voltage between the terminals (detection signal) needs to be set at a larger current than the photocurrent so as to depend on a current regulated by the current control section. This makes it possible to widely secure the voltage between the terminals which voltage is set in a wide range obtained by subtracting, from the power supply voltage, a voltage for causing the current control section to operate.

Moreover, the first current source, which generates the first auxiliary current even when no light is inputted, can supply the first auxiliary current to the current amplifier regardless of presence of the light input. This makes it possible to reduce a switching noise occurring in the current amplifier, and to prevent an oscillation phenomenon.

The optical sensor is preferably configured such that: the current control section is a first transistor (the transistor Tr4) that is turned on for causing the current between the terminals to flow and that is turned off for stopping the current between the terminals; and the first current source includes a current mirror circuit that causes the first auxiliary current to flow, and the first transistor and a second transistor (the transistor Tr13) that is included in the current mirror circuit are identical in operation voltage.

In the above configuration, the first and the second transistors are identical in operation voltage. Therefore, in a case where the first transistor of the current control section can be turned on when no light is inputted, the second transistor of the current mirror circuit of the first current source can also operate. Accordingly, even when no light is inputted, the first current source operates, so that the first auxiliary current can be generated.

The optical sensor is preferably configured to further include: a zero bias section (the zero bias circuit 23) for setting a bias voltage between terminals of the photoelectric conversion element at zero by applying an identical potential to one and the other of the terminals of the photoelectric conversion element, the second transistor generating a potential to be applied to the one of the terminals of the photoelectric conversion element.

In the above configuration, the zero bias section sets a bias voltage of the photoelectric conversion element at zero. According to this, the photoelectric conversion element does not need to charge a capacitance thereof even when the photocurrent flows therein. This allows a higher signal response speed of the optical sensor.

Further, the zero bias section can use, as a potential to be applied to the photoelectric conversion element, a potential generated by the second transistor. This makes it unnecessary for the zero bias section to generate the potential to be applied to the photoelectric conversion element, so that expansion of a circuit scale of the optical sensor can be prevented.

The optical sensor is preferably configured to further include an auxiliary current source (the bandgap current source BG) for, by being driven by the voltage between the terminals without depending on the power supply voltage, generating a second auxiliary current that is inputted to the current amplifier.

In the above configuration, the first current source, which can operate even when the voltage between the terminals is at a low level, is driven by the voltage between the terminals which voltage depends on the power supply voltage. This causes a variation in first auxiliary current due to an influence of a variation in power supply voltage.

For solving the above problem, by providing an auxiliary current source that is driven without depending on the power supply voltage, it is possible to obtain a second auxiliary current that is not influenced by the power supply voltage. According to this, the second auxiliary current can reduce an influence of the variation in first auxiliary current.

The optical sensor is preferably configured to further include a second current source (the second current source CS2) for generating an additional current to be added to the output current of the current amplifier.

In the above configuration, the second current source adds the additional current to the output current of the current amplifier. This makes it possible to prevent a change occurring on an output side of the current amplifier due to a variation in current gain of the current amplifier.

The optical sensor is preferably configured to further include a constant voltage circuit (the constant voltage circuit 24 or 25) for generating a constant voltage as a driving voltage of the current amplifier when the voltage between the terminals reaches a maximum. Specifically, the optical sensor is preferably configured such that the constant voltage circuit includes a capacitor (the capacitor C) or a diode (any one of the transistors Tr51 through Tr53) for generating the constant voltage in accordance with the voltage between the terminals.

In the above configuration, when the voltage between the terminals reaches the maximum, the current amplifier is driven at the constant voltage generated by the constant voltage circuit. According to this, the current amplifier can stably operate at the constant voltage without suffering from the variation in power supply voltage.

The optical sensor is preferably configured such that the constant voltage circuit further includes a resistor (the resistor R51) connected, between the first terminal and the second terminal, in series with the diode, and outputs the constant voltage from a space between the resistor and the diode.

A lower bias voltage (bias voltage closer to a forward bias) of the photoelectric conversion element allows the photoelectric conversion element to have a larger capacitance. This causes a variation in response of the optical sensor. For solving the above problem, in the above configuration, the constant voltage circuit applies the voltage between the terminals to the diode via the resistor. Since the driving voltage of the current control section depends on a resistance value of the resistor when the voltage between terminals shifts from a low level to a high level, use of the resister in the constant voltage circuit makes it possible to more easily secure a bias voltage of the photoelectric conversion element than use of, for example, a transistor.

An electronics device (the copying machine 301) including any one of the above optical sensors can be provided with a high-performance optical sensor. The configuration, which allows an improvement in function of the electronics device, is useful.

[Supplementary Note]

The present invention is not limited to the description of the embodiments above, but may be altered by a skilled person within the scope of the claims. That is, an embodiment based on a proper combination of technical means appropriately altered within the scope of the claims is encompassed in the technical scope of the present invention.

INDUSTRIAL APPLICABILITY

An optical sensor of the present invention, which optical sensor is configured as a photo interrupter, has a function of detecting not only an object and a motion speed of an object but also a movement direction of an object and an origin position. Therefore, the optical sensor is suitably applicable to, for example, electronics devices such as a digital camera, a copying machine, a printer, and a portable device. The optical sensor of the present invention is also suitably applicable to a smoke sensor, a proximity sensor, a range sensor, and the like for each of which a sufficient capacity cannot be ensured.

REFERENCE SIGNS LIST

| | |
|---|---|
| 1 to 6 | light-receiving sensors (optical sensors) |
| 1A | light-receiving sensor (optical sensor) |
| 11 to 16 | light-receiving elements |
| 11A | light-receiving element |
| 21 | detection signal generating section |
| 23 | zero bias circuit (zero bias section) |
| 24 and 25 | constant voltage circuits |
| 301 | copying machine (electronics device) |
| BG | bandgap current source (auxiliary current source) |
| CM1 | first current mirror circuit (current amplifier) |
| CM2 | second current mirror circuit |
| CS1 | first current source |
| CS2 | second current source |
| CS11 | first current source |
| I1 | current (first auxiliary current) |
| I2 | current (second auxiliary current) |
| PD | photodiode |
| T1 | terminal (first terminal) |
| T2 | terminal (second terminal) |
| Tr1 | transistor |
| Tr4 | transistor (current control section, first transistor) |
| Tr13 | transistor (second transistor) |
| Vcc | power supply voltage |

The invention claimed is:

1. An optical sensor that has two terminals and detects a light input by changing, with respect to a fixed potential of a first terminal of the two terminals, a potential of a second terminal of the two terminals to which second terminal a power supply voltage is applied, said optical sensor comprising:

a photoelectric conversion element for generating a photocurrent by use of the light input;

a first current source for generating a first auxiliary current by being driven by a voltage between terminals, which are the first terminal and the second terminal;

a current amplifier for amplifying the photocurrent;

a current control section for stopping a current between the terminals, which are the first terminal and the second terminal, in accordance with an output current that is outputted from the current amplifier when light is inputted, and causing the current between the terminals to flow in accordance with an output current that is outputted from the current amplifier when no light is inputted, the first current source generating the first auxiliary current regardless of presence of the light input either by inputting the first auxiliary current to the current amplifier or by adding the first auxiliary current to the output current of the current amplifier.

2. The optical sensor as set forth in claim 1, wherein:
  the current control section is a first transistor that is turned on for causing the current between the terminals to flow and that is turned off for stopping the current between the terminals; and
  the first current source includes a current mirror circuit that causes the first auxiliary current to flow, and the first transistor and a second transistor that is included in the current mirror circuit are identical in operation voltage.

3. The optical sensor as set forth in claim 2, further comprising:
  a zero bias section for setting a bias voltage between terminals of the photoelectric conversion element at zero by applying an identical potential to one and the other of the terminals of the photoelectric conversion element,
  the second transistor generating a potential to be applied to the one of the terminals of the photoelectric conversion element.

4. The optical sensor as set forth in claim 1, further comprising an auxiliary current source for, by being driven by the voltage between the terminals without depending on the power supply voltage, generating a second auxiliary current that is inputted to the current amplifier.

5. The optical sensor as set forth in claim 1, further comprising a second current source for generating an additional current to be added to the output current of the current amplifier.

6. The optical sensor as set forth in claim 1, further comprising a constant voltage circuit for generating a constant voltage as a driving voltage of the current amplifier when the voltage between the terminals reaches a maximum.

7. The optical sensor as set forth in claim 6, wherein the constant voltage circuit includes a capacitor for generating the constant voltage in accordance with the voltage between the terminals.

8. The optical sensor as set forth in claim 6, wherein the constant voltage circuit includes a diode for generating the constant voltage in accordance with the voltage between the terminals.

9. The optical sensor as set forth in claim 8, wherein the constant voltage circuit further includes a resistor connected, between the first terminal and the second terminal, in series with the diode, and outputs the constant voltage from a space between the resistor and the diode.

10. An electronics device comprising an optical sensor as set forth in claim 1.

* * * * *